(12) United States Patent
Watanabe et al.

(10) Patent No.: US 7,090,222 B2
(45) Date of Patent: Aug. 15, 2006

(54) SHAFT SEALING ASSEMBLY FOR VACUUM PROCESSING APPARATUS

(75) Inventors: Tetsuya Watanabe, Tsu (JP); Hiroki Mori, Tsu (JP); Chohei Okuno, Tsu (JP)

(73) Assignee: Teijin Seiki Co., Ltd., Tokyo (JP)

( * ) Notice: Subject to any disclaimer, the term of this patent is extended or adjusted under 35 U.S.C. 154(b) by 372 days.

(21) Appl. No.: 09/981,807

(22) Filed: Oct. 19, 2001

(65) Prior Publication Data

US 2002/0047242 A1 Apr. 25, 2002

(30) Foreign Application Priority Data

Oct. 25, 2000 (JP) .............................. 2000-324831
Sep. 25, 2001 (JP) .............................. 2001-291877

(51) Int. Cl.
*F16J 15/02* (2006.01)

(52) U.S. Cl. .................... 277/549; 277/551; 277/555; 277/913

(58) Field of Classification Search ........ 277/549–577, 277/913

See application file for complete search history.

(56) References Cited

U.S. PATENT DOCUMENTS

| | | | |
|---|---|---|---|
| 2,804,325 A * | 8/1957 | Riesing ...................... 277/549 |
| 3,128,887 A | 4/1964 | Le Guennec |
| 3,347,604 A | 10/1967 | Lavelle |
| 3,383,117 A | 5/1968 | Fagel |
| 3,495,843 A * | 2/1970 | Andersen ..................... 277/549 |
| 3,811,658 A * | 5/1974 | Heidrich ..................... 366/76.9 |
| 4,133,542 A * | 1/1979 | Janian et al. ................ 277/555 |
| 4,331,339 A * | 5/1982 | Reinsma ..................... 305/103 |
| 4,383,691 A * | 5/1983 | Potter ......................... 277/559 |
| 4,437,821 A * | 3/1984 | Ogawa ........................ 418/104 |
| 4,573,690 A * | 3/1986 | DeHart et al. ............... 277/309 |
| 4,586,718 A * | 5/1986 | Stephenson et al. ........ 277/422 |
| 5,044,642 A * | 9/1991 | Vogt et al. ................... 277/559 |
| 5,054,440 A * | 10/1991 | Kadokawa ................. 123/90.5 |
| 5,343,313 A * | 8/1994 | Fergason ..................... 349/11 |
| 5,671,656 A * | 9/1997 | Cyphers et al. .............. 92/172 |
| 5,676,472 A | 10/1997 | Solomon |
| 5,853,502 A * | 12/1998 | Aihara et al. ............... 148/319 |
| 5,984,316 A * | 11/1999 | Balsells ...................... 277/553 |
| 6,296,255 B1 * | 10/2001 | Hashimoto .................. 277/558 |
| 6,676,132 B1 * | 1/2004 | Takebayashi et al. ....... 277/560 |
| 6,736,404 B1 * | 5/2004 | Shuster ....................... 277/559 |

FOREIGN PATENT DOCUMENTS

| | | |
|---|---|---|
| DE | 4018278 A | 12/1991 |
| DE | 19951317 | 4/2000 |
| EP | 0266732 A | 5/1988 |
| EP | 0879977 A | 11/1998 |
| JP | 60199544 A * | 10/1985 |

\* cited by examiner

*Primary Examiner*—Vishal Patel
(74) *Attorney, Agent, or Firm*—Andrew C. Aitken; Venable LLP

(57) ABSTRACT

Herein disclosed is a shaft sealing apparatus which comprises a vacuum casing formed with a vacuum chamber, a driving shaft having an outer cylindrical surface and movably extending in the vacuum chamber of the vacuum casing, and a sealing ring in the form of an annular ring shape and including a sealing lip held in contact with the outer cylindrical surface of the driving shaft, an annular spring member operative to impart a force to the sealing lip to ensure that the sealing lip is held in tight contact with the outer cylindrical surface of the driving shaft, and a peripheral portion radially outwardly extending from the sealing lip, in which the outer cylindrical surface of the driving shaft is smaller in surface roughness Ra than 0.1 (μm).

20 Claims, 7 Drawing Sheets

F I G. 1
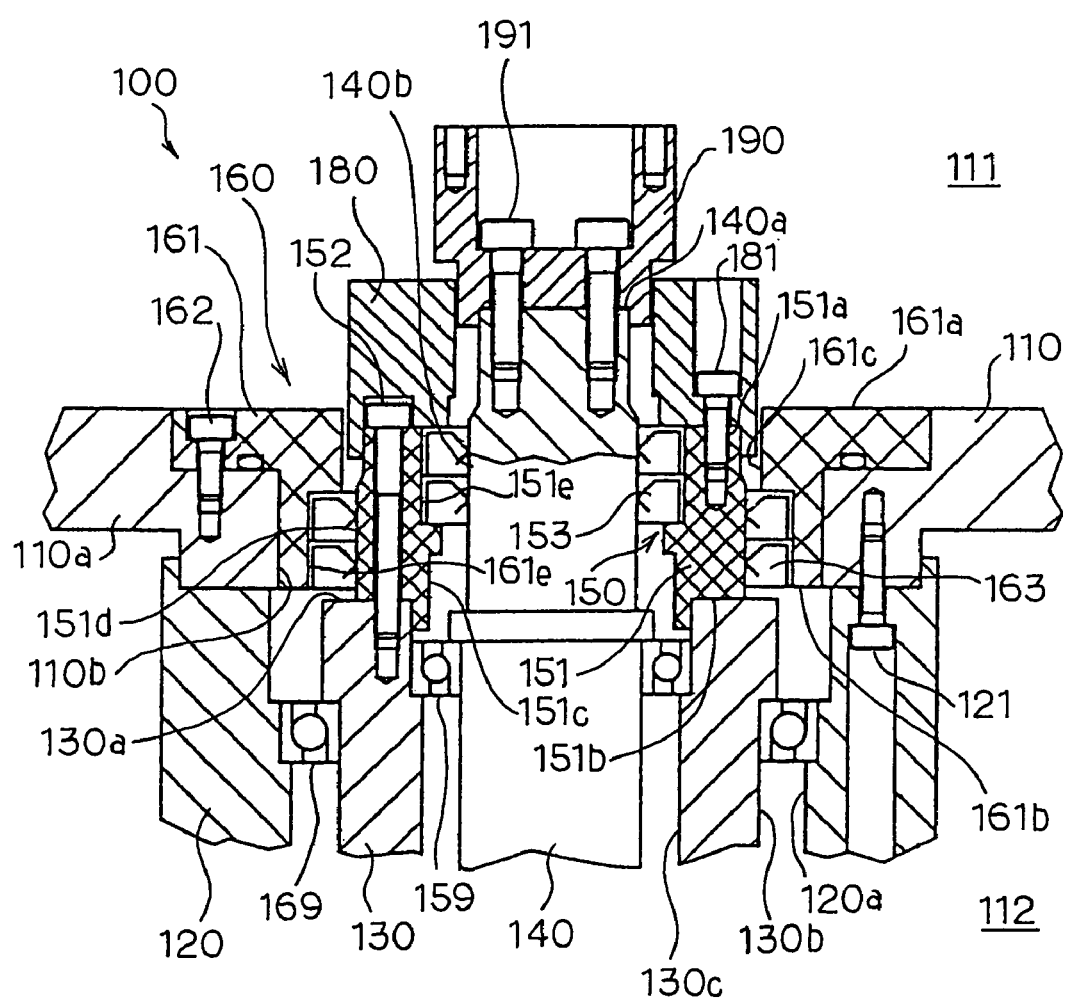

SHAFT SEALING ASSEMBLY FOR VACUUM PROCESSING APPARATUS

BACKGROUND OF THE INVENTION

1. Field of the Invention

The present invention relates to a shaft sealing apparatus for use in a vacuum processing apparatus (hereinafter simply referred to as a "shaft sealing apparatus"), and more particularly to a shaft sealing apparatus for sealing the gaps between a driving shaft and other parts around the driving shaft to have the driving shaft movably extending in a vacuum chamber and operatively connected with a handling mechanism disposed in the vacuum chamber.

2. Description of the Related Art

Up until now, there have been proposed a wide variety of conventional shaft sealing apparatuses each designed to seal the gaps between a driving shaft and other parts around the driving shaft to have the driving shaft movably extending in a vacuum chamber and operatively connected with a handling mechanism disposed in the vacuum chamber.

The conventional shaft sealing apparatuses thus proposed have so far been available for various vacuum processing apparatuses such as a semiconductor producing apparatus. In general, the vacuum processing apparatus of this kind is equipped with a vacuum casing formed with a vacuum chamber and a handling mechanism such as a manipulator designed to handle wafers and other substrates in the vacuum chamber. The vacuum processing apparatus thus constructed is operative to produce various precision products including an integrated circuit (IC), a large scale integrated circuit (LSI) and a liquid crystal display (LCD) base plate. The precision products produced by the vacuum processing apparatus are used for a semiconductor device, a liquid crystal display (LCD) and other objects.

In recent years, the precision products described in the above are produced in the vacuum chamber maintained at a constant vacuum level, for example, a high vacuum level ($1\times10^{-1}$ to $1\times10^{-5}$ Pa) and an ultra high vacuum level (less than $1\times10^{-5}$ Pa), resulting from the fact that the process of producing the precision products has been progressed to obtain more excellent quality and to reduce inferior products. The conventional shaft sealing apparatus is, therefore, installed in the vacuum processing apparatus to have the vacuum chamber maintained at a constant vacuum level.

The conventional shaft sealing apparatus of this type comprises a vacuum casing formed with a vacuum chamber and an opening to have the vacuum chamber held in communication with the atmosphere through the opening, a shaft housing fixedly connected with the vacuum casing, and a driving shaft received in the shaft housing to be rotatably supported by the shaft housing. The driving shaft has a first axial end extending in the vacuum chamber to be operatively connected with the handling mechanism disposed in the vacuum chamber, and a second axial end extending in the atmosphere to be operatively connected with an electric motor. The handling mechanism includes a handling member pivotally supported by the driving shaft to be operative to handle wafers and other substrates in the vacuum chamber.

The conventional shaft sealing apparatus further comprises a plurality of magnetic fluid seals intervening between the driving shaft and the shaft housing to hermetically seal the gap between the driving shaft and the shaft housing. The magnetic fluid seals are axially disposed in series between the driving shaft and the shaft housing, resulting from the fact that each of the magnetic fluid seals has a resistance pressure of approximately 20 kPa.

The conventional shaft sealing apparatus thus constructed, however, encounters such a problem that the conventional shaft sealing apparatus is complicated in construction and thus increased in size, resulting from the fact that the conventional shaft sealing apparatus is required to comprise a number of magnetic fluid seals axially disposed in series between the driving shaft and the shaft housing.

The conventional shaft sealing apparatus described in the above encounters another problem that the conventional shaft sealing apparatus is difficult to assemble, resulting from the fact that the conventional shaft sealing apparatus is complicated in construction and thus large in size.

The conventional shaft sealing apparatus described in the above encounters further problem that the driving shaft cannot be axially movably supported by the shaft housing, resulting from the fact that the magnetic fluid seals intervene between the driving shaft and the shaft housing.

While it has been described in the above that the conventional shaft sealing apparatus comprises a driving shaft movably extending in the vacuum chamber, the driving shaft may be replaced by a driving shaft accommodated in a vacuum chamber in order to have the vacuum chamber maintained at a constant vacuum level. This type of shaft sealing apparatus is disclosed in Japanese Patent Publication No. 2761438.

The conventional shaft sealing apparatus of this type comprises a vacuum casing formed with a casing chamber and an opening, a shaft housing formed with a housing chamber and axially movably connected with the vacuum casing through a bellows unit, and a driving shaft received in the shaft housing to be rotatably supported by the shaft housing. The casing chamber is held in communication with the housing chamber through the opening to ensure that the casing chamber and the housing chamber collectively define a vacuum chamber. The driving shaft is accommodated in the vacuum chamber to be operatively connected at one end with the handling mechanism disposed in the casing chamber and at the other end with an electric motor disposed in the housing chamber. The handling mechanism includes a handling member pivotally supported by the driving shaft to be operative to handle wafers and other substrates in the casing chamber.

The conventional shaft sealing apparatus thus constructed, however, encounters such a problem that the conventional shaft sealing apparatus is complicated in construction and thus increased in size, resulting from the fact that the conventional shaft sealing apparatus is required to comprise a shaft housing axially movably connected with the vacuum casing through the bellows unit.

The conventional shaft sealing apparatus described in the above encounters another problem that the exhaust load of the vacuum chamber is increased, resulting from the fact that the vacuum chamber is increased in space to have the driving shaft, the electric motor and other parts accommodated in the vacuum chamber.

The conventional shaft sealing apparatus described in the above encounters further problem that dust particles generated from the driving shaft, the electric motor and other parts are discharged into the vacuum chamber, resulting from the fact that the driving shaft, the electric motor and other parts are accommodated in the vacuum chamber.

SUMMARY OF THE INVENTION

It is, therefore, an object of the present invention to provide a shaft sealing apparatus that is excellent in characteristic to seal the gaps between a driving shaft and other parts around the driving shaft.

It is another object of the present invention to provide a shaft sealing apparatus that can be simple in construction and thus reduced in size.

It is further object of the present invention to provide a shaft sealing apparatus that can be assembled with facility.

In accordance with a first aspect of the present invention, there is provided a shaft sealing apparatus, comprising: a vacuum casing formed with a vacuum chamber; a driving shaft having an outer cylindrical surface and movably extending in the vacuum chamber of the vacuum casing; and a sealing ring in the form of an annular ring shape and including a sealing lip held in contact with the outer cylindrical surface of the driving shaft, an annular spring member operative to impart a force to the sealing lip to ensure that the sealing lip is held in tight contact with the outer cylindrical surface of the driving shaft, and a peripheral portion radially outwardly extending from the sealing lip, in which the outer cylindrical surface of the driving shaft is smaller in surface roughness Ra than 0.1 µm.

The outer cylindrical surface of the driving shaft may be larger in Vickers hardness Hv than 650.

The annular spring member of the sealing ring may be made of a metal wire in the form of a helical shape and is of a circular cross-section taken on the plane perpendicular to the center axis passing therethrough.

The annular spring member of the sealing ring may be made of a metal plate in the form of an annular ring shape and is of a channel-shaped cross-section taken on the plane perpendicular to the center axis passing therethrough.

The sealing lip of the sealing ring may be made of a synthetic resin constituted by an ultra high molecular weight compound.

In accordance with a second aspect of the present invention, there is provided a shaft sealing apparatus, comprising: a vacuum casing formed with a vacuum chamber and having a base portion formed with an opening to have the vacuum chamber of the vacuum casing held in communication with the atmosphere through the opening of the vacuum casing; a shaft housing in the form of a cylindrical hollow shape and fixedly connected with the base portion of the vacuum casing, the shaft housing having an inner cylindrical surface; a driving shaft in the form of a cylindrical shape and received in the shaft housing to be movably supported by the shaft housing, the driving shaft held in coaxial alignment with the shaft housing and having a first axial end extending in the vacuum chamber of the vacuum casing, a second axial end extending in the atmosphere, and an outer cylindrical surface smaller in diameter than the inner cylindrical surface of the shaft housing; and a sealing unit received in the opening of the vacuum casing and fixedly supported by the base portion of the vacuum casing, the sealing unit including a retaining member in the form of an annular ring shape and fixedly connected with the base portion of the vacuum casing, and a sealing ring in the form of an annular ring shape and securely retained by the retaining member of the sealing unit, the sealing ring of the sealing unit intervening between the driving shaft and the retaining member of the sealing unit to hermetically seal the gap between the driving shaft and the retaining member of the sealing unit, the sealing ring of the sealing unit including an annular resilient member formed with an annular groove, and an annular spring member received in the annular groove of the annular resilient member and retained by the annular resilient member, the annular resilient member of the sealing ring having a peripheral portion securely retained by the retaining member, and a sealing lip integrally formed with the peripheral portion of the annular resilient member and radially inwardly extending from the peripheral portion of the annular resilient member to be held in contact with the outer cylindrical surface of the driving shaft, the annular spring member of the sealing ring operative to impart a force to the sealing lip of the annular resilient member to ensure that the sealing lip of the annular resilient member is held in tight contact with the outer cylindrical surface of the driving shaft.

In accordance with a third aspect of the present invention, there is provided a shaft sealing apparatus, comprising: a vacuum casing formed with a vacuum chamber and having a base portion formed with an opening to have the vacuum chamber of the vacuum casing held in communication with the atmosphere through the opening of the vacuum casing; a shaft housing in the form of a cylindrical hollow shape and fixedly connected with the base portion of the vacuum casing, the shaft housing having an inner cylindrical surface; a sleeve shaft in the form of a cylindrical hollow shape and received in the shaft housing to be movably supported by the shaft housing, the sleeve shaft held in coaxial alignment with the shaft housing and having a first axial end extending in the vacuum chamber of the vacuum casing, a second axial end extending in the atmosphere, an outer cylindrical surface smaller in diameter than the inner cylindrical surface of the shaft housing, and an inner cylindrical surface; a center shaft in the form of a cylindrical shape and received in the sleeve shaft to be movably supported by the sleeve shaft, the center shaft held in coaxial alignment with the sleeve shaft and having a first axial end extending in the vacuum chamber of the vacuum casing, a second axial end extending in the atmosphere, and an outer cylindrical surface smaller in diameter than the inner cylindrical surface of the sleeve shaft; a first sealing unit provided on the first axial end of the sleeve shaft and held in coaxial alignment with the sleeve shaft, the first sealing unit including a retaining member in the form of an annular ring shape and fixedly connected with the first axial end of the sleeve shaft, and a sealing ring in the form of an annular ring shape and securely retained by the retaining member of the first sealing unit, the sealing ring of the first sealing unit intervening between the center shaft and the retaining member of the first sealing unit to hermetically seal the gap between the center shaft and the retaining member of the first sealing unit, the sealing ring of the first sealing unit including an annular resilient member formed with an annular groove, and an annular spring member received in the annular groove of the annular resilient member and retained by the annular resilient member, the annular resilient member of the sealing ring having a peripheral portion securely retained by the retaining member, and a sealing lip integrally formed with the peripheral portion of the annular resilient member and radially inwardly extending from the peripheral portion of the annular resilient member to be held in contact with the outer cylindrical surface of the center shaft, the annular spring member of the sealing ring operative to impart a force to the sealing lip of the annular resilient member to ensure that the sealing lip of the annular resilient member is held in tight contact with the outer cylindrical surface of the center shaft; and a second sealing unit received in the opening of the vacuum casing and fixedly supported by the base portion of the vacuum casing, the second sealing unit including a retaining member in the form of an annular ring shape and fixedly connected with the base portion of the vacuum casing, and a sealing ring in the form of an annular ring shape and securely retained by the retaining member of the second sealing unit, the sealing ring of the second sealing unit intervening between the retaining member of the first sealing unit and the retaining member of the second sealing unit to hermetically seal the gap between the retaining member of the first sealing unit and the retaining member of the second sealing unit, the sealing ring of the second sealing unit including an annular resilient member formed with an annular groove, and an annular spring member received in the annular groove of the annular resilient member and retained by the annular resilient member, the annular resilient member of the sealing ring having a peripheral portion securely retained by the retaining member, and a sealing lip integrally formed with the peripheral portion of the annular resilient member and radially inwardly extending from the peripheral portion of the annular resilient member to be held in contact with the outer cylindrical surface of the first sealing unit, the annular spring member of the sealing ring operative to impart a force to the sealing lip of the annular resilient member to ensure that the sealing lip of the annular resilient member is held in tight contact with the outer cylindrical surface of the first sealing unit.

In accordance with a fourth aspect of the present invention, there is provided a shaft sealing apparatus, comprising: a vacuum casing formed with a vacuum chamber and having a base portion formed with an opening to have the vacuum chamber of the vacuum casing held in communication with the atmosphere through the opening of the vacuum casing; a shaft housing in the form of a cylindrical hollow shape and fixedly connected with the base portion of the vacuum casing, the shaft housing having an inner cylindrical surface; a sleeve shaft in the form of a cylindrical hollow shape and received in the shaft housing to be movably supported by the shaft housing, the sleeve shaft held in coaxial alignment with the shaft housing and having a first axial end extending in the vacuum chamber of the vacuum casing, a second axial end extending in the atmosphere, an outer cylindrical surface smaller in diameter than the inner cylindrical surface of the shaft housing, and an inner cylindrical surface; a center shaft in the form of a cylindrical shape and received in the sleeve shaft to be movably supported by the sleeve shaft, the center shaft held in coaxial alignment with the sleeve shaft and having a first axial end extending in the vacuum chamber of the vacuum casing, a second axial end extending in the atmosphere, and an outer cylindrical surface smaller in diameter than the inner cylindrical surface of the sleeve shaft; a first sealing unit fixedly supported by the sleeve shaft, the first sealing unit including a retaining member in the form of an annular ring shape and fixedly supported by the sleeve shaft, and a sealing ring in the form of an annular ring shape and securely retained by the retaining member of the first sealing unit, the sealing ring of the first sealing unit intervening between the center shaft and the retaining member of the first sealing unit to hermetically seal the gap between the center shaft and the retaining member of the first sealing unit, the sealing ring of the first sealing unit including an annular resilient member formed with an annular groove, and an annular spring member received in the annular groove of the annular resilient member and retained by the annular resilient member, the annular resilient member of the sealing ring having a peripheral portion securely retained by the retaining member, and a sealing lip integrally formed with the peripheral portion of the annular resilient member and radially inwardly extending from the peripheral portion of the annular resilient member to be held in contact with the outer cylindrical surface of the center shaft, the annular spring member of the sealing ring operative to impart a force to the sealing lip of the annular resilient member to ensure that the sealing lip of the annular resilient member is held in tight contact with the outer cylindrical surface of the center shaft; and a second sealing unit fixedly supported by the base portion of the vacuum casing, the second sealing unit including a retaining member in the form of an annular ring shape and fixedly supported by the base portion of the vacuum casing, and a sealing ring in the form of an annular ring shape and securely retained by the retaining member of the second sealing unit, the sealing ring of the second sealing unit intervening between the sleeve shaft and the retaining member of the second sealing unit to hermetically seal the gap between the sleeve shaft and the retaining member of the second sealing unit, the sealing ring of the second sealing unit including an annular resilient member formed with an annular groove, and an annular spring member received in the annular groove of the annular resilient member and retained by the annular resilient member, the annular resilient member of the sealing ring having a peripheral portion securely retained by the retaining member, and a sealing lip integrally formed with the peripheral portion of the annular resilient member and radially inwardly extending from the peripheral portion of the annular resilient member to be held in contact with the outer cylindrical surface of the sleeve shaft, the annular spring member of the sealing ring operative to impart a force to the sealing lip of the annular resilient member to ensure that the sealing lip of the annular resilient member is held in tight contact with the outer cylindrical surface of the sleeve shaft.

The shaft sealing apparatus may further comprise a first labyrinth seal unit intervening between the sleeve shaft and the center shaft to be exposed to the vacuum chamber of the vacuum casing, and a second labyrinth seal unit intervening between the vacuum casing and the sleeve shaft to be exposed to the vacuum chamber of the vacuum casing, the first labyrinth seal unit including an outer ring member provided on the first axial end of the sleeve shaft, and an inner ring member provided on the first axial end of the center shaft, the outer and inner ring members of the first labyrinth seal unit collectively forming an interstice therebetween, the second labyrinth seal unit including an outer ring member provided on the base portion of the vacuum casing, and an inner ring member provided on the first axial end of the sleeve shaft, the outer and inner ring members of the second labyrinth seal unit collectively forming an interstice therebetween.

The shaft sealing apparatus may further comprise a base member in the form of a circular shape and provided on the first axial end of the center shaft, a first fixed member in the form of an annular ring shape and provided on the first axial end of the sleeve shaft, and a second fixed member in the form of an annular ring shape and provided on the base portion of the vacuum casing, the base member and the first fixed member collectively constituting the first labyrinth seal unit, the first and second fixed members collectively constituting the second labyrinth seal unit.

BRIEF DESCRIPTION OF THE DRAWINGS

The features and advantages of a shaft sealing apparatus according to the present invention will more clearly be understood from the following description taken in conjunction with the accompanying drawings in which:

FIG. 1 is a fragmentary cross-sectional view of a first embodiment of the shaft sealing apparatus according to the present invention;

DESCRIPTION OF THE PREFERRED EMBODIMENTS

Figure 2:
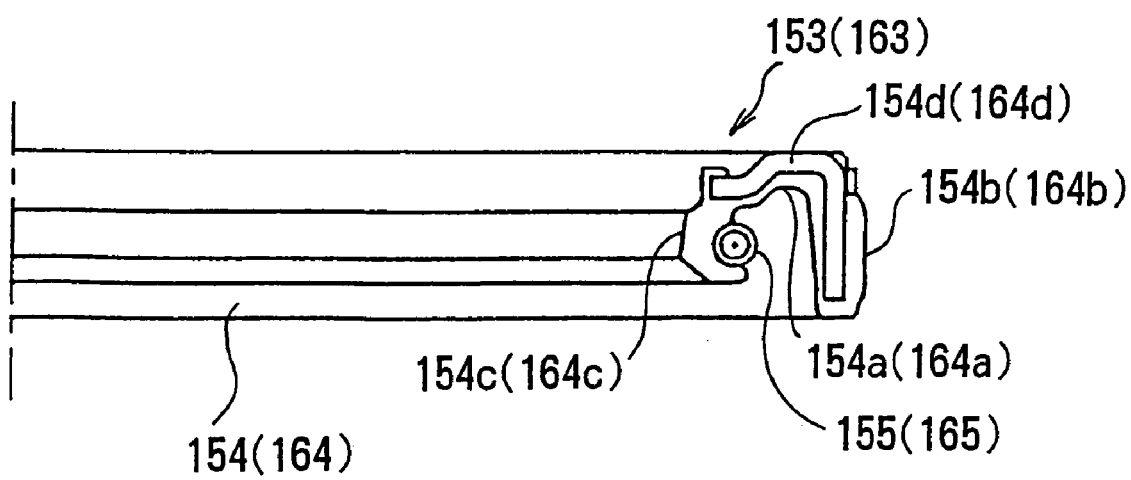
FIG. 2 is an enlarged cross-sectional view of a sealing ring forming part of the shaft sealing apparatus shown in FIG. 1.

Throughout the following detailed description, similar reference characters and numbers refer to similar elements in all figures of the drawings.

The first preferred embodiment of the shaft sealing apparatus according to the present invention will now be described in detail in accordance with the accompanying drawings.

Referring now to the drawings, in particular to FIGS. 1 to 5, there is shown the first preferred embodiment of the shaft sealing apparatus according to the present invention. The shaft sealing apparatus 100 is available for a vacuum processing apparatus equipped with a handling mechanism. The shaft sealing apparatus 100 comprises a vacuum casing 110 formed with a vacuum chamber 111, and a shaft housing 120 in the form of a cylindrical hollow shape and fixedly connected with the vacuum casing 110. The vacuum casing 110 has a base portion 110a formed with an opening 110b to have the vacuum chamber 111 of the vacuum casing 110 held in communication with the atmosphere 112 through the opening 110b of the vacuum casing 110. The shaft housing 120 is fixedly connected with the base portion 110a of the vacuum casing 110 by bolts 121. The shaft housing 120 has an inner cylindrical surface 120a.

The shaft sealing apparatus 100 further comprises a sleeve shaft 130 in the form of a cylindrical hollow shape and received in the shaft housing 120 to be movably supported by the shaft housing 120. The sleeve shaft 130 is held in coaxial alignment with the shaft housing 120 and rotatable around its own axis with respect to the shaft housing 120. The sleeve shaft 130 has a first axial end 130a extending in the vacuum chamber 111 of the vacuum casing 110, a second axial end, not shown, extending in the atmosphere 112, an outer cylindrical surface 130b smaller in diameter than the inner cylindrical surface 120a of the shaft housing 120, and an inner cylindrical surface 130c. The sleeve shaft 130 constitutes a driving shaft having an outer cylindrical surface and movably extending in the vacuum chamber 111 of the vacuum casing 112.

While the shaft sealing apparatus 100 has been described in the above as comprising a sleeve shaft 130 rotatable around its own axis with respect to the shaft housing 120, the sleeve shaft 130 may be replaced by a sleeve shaft axially movable along its own axis with respect to said shaft housing 120 according to the present invention.

Though the shaft sealing apparatus 100 has been described in the above as comprising a sleeve shaft 130 in the form of a cylindrical hollow shape and received in the shaft housing 120 to be held in coaxial alignment with the shaft housing 120, the sleeve shaft 130 may be replaced by a plurality of sleeve shafts each in the form of a cylindrical hollow shape and received in the shaft housing 120 to be held in coaxial alignment with the shaft housing 120 according to the present invention.

The shaft sealing apparatus 100 further comprises a center shaft 140 in the form of a cylindrical shape and received in the sleeve shaft 130 to be movably supported by the sleeve shaft 130. The center shaft 140 is held in coaxial alignment with the sleeve shaft 130 and rotatable around its own axis with respect to the sleeve shaft 130. The center shaft 140 has a first axial end 140a extending in the vacuum chamber 111 of the vacuum casing 110, a second axial end, not shown, extending in the atmosphere 112, and an outer cylindrical surface 140b smaller in diameter than the inner cylindrical surface 130c of the sleeve shaft 130. The center shaft 140 constitutes a driving shaft having an outer cylindrical surface and movably extending in the vacuum chamber 111 of the vacuum casing 112.

While the shaft sealing apparatus 100 has been described in the above as comprising a center shaft 140 rotatable around its own axis with respect to the sleeve shaft 130, the center shaft 140 may be replaced by a center shaft axially movable along its own axis with respect to said sleeve shaft 130 according to the present invention.

The shaft sealing apparatus 100 further comprises a first sealing unit 150 provided on the first axial end 130a of the sleeve shaft 130 and held in axial alignment with the sleeve shaft 130. The first sealing unit 150 includes a retaining member 151 in the form of an annular ring shape and fixedly connected with the first axial end 130a of the sleeve shaft 130 by bolts 152, and a plurality of sealing rings 153 securely retained by the retaining member 151 of the first sealing unit 150 to be held in axial alignment with each other. Each of the sealing rings 153 of the first sealing unit 150 is in the form of an annular ring shape and intervenes between the center shaft 140 and the retaining member 151 of the first sealing unit 150 to hermetically seal the gap between the center shaft 140 and the retaining member 151 of the first sealing unit 150. The sealing rings 153 of the first sealing unit 150 are held in contact with each other.

The retaining member 151 of the first sealing unit 150 has a first axial end 151a extending in the vacuum chamber 111 of the vacuum casing 110, a second axial end 151b held in contact with the first axial end 130a of the sleeve shaft 130, an inner cylindrical surface 151c larger in diameter than the outer cylindrical surface 140b of the center shaft 140, and an outer cylindrical surface 151d. The inner cylindrical surface 151c of the retaining member 151 is formed with an annular ledge 151e connected with the first axial end 151a of the retaining member 151. The retaining member 151 of the first sealing unit 150 forms part of the sleeve shaft 130 extending in the vacuum chamber 111 of the vacuum casing 110.

Each of the sealing rings 153 of the first sealing unit 150 includes an annular resilient member 154 formed with an annular groove 154a, and an annular spring member 155 received in the annular groove 154a of the annular resilient member 154 and retained by the annular resilient member 154 as shown in FIG. 2. The annular resilient member 154 of the sealing ring 153 has a peripheral portion 154b securely retained by the annular ledge 151e of the retaining member 151, and a sealing lip 154c integrally formed with the peripheral portion 154b of the annular resilient member 154 and radially inwardly extending from the peripheral portion 154b of the annular resilient member 154 to be held in contact with the outer cylindrical surface 140b of the center shaft 140. The sealing lip 154c of the annular resilient member 154 is made of a synthetic resin constituted by an ultra high molecular weight compound.

The annular resilient member 154 of the sealing ring 153 may have a reinforcing portion 154d covered by a rubber and intervening between the peripheral portion 154b of the annular resilient member 154 and the sealing lip 154c of the annular resilient member 154 to have the resilient member 154 reinforced with the annular reinforcing portion 154d. The reinforcing portion 154d of the annular resilient member 154 is made of a metal plate in the form of an annular ring shape and is of an L-shaped cross-section taken on the plane perpendicular to the center axis passing therethrough.

The annular spring member 155 of the sealing ring 153 is operative to impart a force to the sealing lip 154c of the annular resilient member 154 to ensure that the sealing lip 154c of the annular resilient member 154 is held in tight contact with the outer cylindrical surface 140b of the center shaft 140. The annular spring member 155 of the sealing ring 153 is made of a metal wire in the form of a helical shape and is of a circular cross-section taken on the plane perpendicular to the center axis passing therethrough. The annular spring member 155 thus constructed is generally called "garter spring".

In the first embodiment of the shaft sealing apparatus according to the present invention, the outer cylindrical surface 140b of the center shaft 140 is smaller in surface roughness Ra defined in Japanese Industrial Standard (JIS) B 0601 than 0.1 μm, and the outer cylindrical surface 140b of the center shaft 140 is larger in Vickers hardness Hv defined in JIS Z 2244 than 650.

The sealing lip 154c of the annular resilient member 154 may be held in contact with the outer cylindrical surface 140b of the center shaft 140 with a vacuum grease constituted by a lubricant containing fluorine. The first sealing unit 150 may include a plurality of sealing rings 153 each having a sealing lip 154c coated with the vacuum grease. The first sealing unit 150 may also include a plurality of sealing rings 153 each having a sealing lip 154c to have the sealing lips 154c collectively form an annular groove filled with the vacuum grease. The first sealing unit 150 may also include a plurality of sealing rings 153 each having a sealing lip 154c and a subsidiary sealing lip held in contact with the outer cylindrical surface 140b of the center shaft 140 to have the sealing lip 154c and the subsidiary sealing lip collectively form an annular groove filled with the vacuum grease.

The shaft sealing apparatus 100 further comprises a first bearing 159 intervening between the center shaft 140 and the sleeve shaft 130 to have the center shaft 140 movably supported by the sleeve shaft 130 through the first bearing 159. The first bearing 159 is located between the sealing ring 153 of the first sealing unit 150 and the second axial end of the center shaft 140 in axially spaced-apart relationship with the sealing ring 153 of the first sealing unit 150.

The shaft sealing apparatus 100 further comprises first driving means constituted by an electric motor, not shown. The electric motor is operatively connected with the second axial end of the center shaft 140 to rotate the center shaft 140 around its own axis. While the driving means has been described in the above as being constituted by an electric motor operatively connected with the second axial end of the center shaft 140, the electric motor may be replaced by a reduction gear unit and an electric motor operatively connected with the second axial end of the center shaft 140 through the reduction gear unit.

The shaft sealing apparatus 100 further comprises a second sealing unit 160 received in the opening 110b of the vacuum casing 110 and fixedly supported by the base portion 110a of the vacuum casing 110. The second sealing unit 160 includes a retaining member 161 in the form of an annular ring shape and fixedly connected with the base portion 110a of the vacuum casing 110 by bolts 162, and a plurality of sealing rings 163 securely retained by the retaining member 161 of the second sealing unit 160 to be held in axial alignment with each other. Each of the sealing rings 163 of the second sealing unit 160 is in the form of an annular ring shape and intervenes between the retaining member 151 of the first sealing unit 150 and the retaining member 161 of the second sealing unit 160 to hermetically seal the gap between the retaining member 151 of the first sealing unit 150 and the retaining member 161 of the second sealing unit 160. The sealing rings 163 of the second sealing unit 160 are held in contact with each other.

The retaining member 161 of the second sealing unit 160 has a first axial end 161a extending in the vacuum chamber 111 of the vacuum casing 110, a second axial end 161b extending in the atmosphere 112, and an inner cylindrical surface 161c larger in diameter than the outer cylindrical surface 151d of the first sealing unit 150. The inner cylindrical surface 161c of the retaining member 161 is formed with an annular ledge 161e connected with the second axial end 161b of the retaining member 161.

Each of the sealing ring 163 of the second sealing unit 160 includes an annular resilient member 164 formed with an annular groove 164a, and an annular spring member 165 received in the annular groove 164a of the annular resilient member 164 and retained by the annular resilient member 164 as shown in FIG. 2. The annular resilient member 164 of the sealing ring 163 has a peripheral portion 164b securely retained by the annular ledge 161e of the retaining member 161, and a sealing lip 164c integrally formed with the peripheral portion 164b of the annular resilient member 164 and radially inwardly extending from the peripheral portion 164b of the annular resilient member 164 to be held in contact with the outer cylindrical surface 151d of the first sealing unit 150. The sealing lip 164c of the annular resilient member 164 is made of a synthetic resin constituted by an ultra high molecular weight compound.

The annular resilient member 164 of the sealing ring 163 may have a reinforcing portion 164d covered by a rubber and intervening between the peripheral portion 164b of the annular resilient member 164 and the sealing lip 164c of the annular resilient member 164 to have the annular resilient member 164 reinforced with the reinforcing portion 164d. The reinforcing portion 164d of the annular resilient member 164 is made of a metal plate in the form of an annular ring shape and is of an L-shaped cross-section taken on the plane perpendicular to the center axis passing therethrough.

The annular spring member 165 of the sealing ring 163 is operative to impart a force to the sealing lip 164c of the annular resilient member 164 to ensure that the sealing lip 164c of the annular resilient member 164 is held in tight contact with the outer cylindrical surface 151d of the first sealing unit 150. The annular spring member 165 of the sealing ring 163 is made of a metal wire in the form of a helical shape and is of a circular cross-section taken on the plane perpendicular to the center axis passing therethrough. The annular spring member 165 thus constructed is generally called "garter spring".

In the first embodiment of the shaft sealing apparatus according to the present invention, the outer cylindrical surface 151d of the first sealing unit 150 is smaller in surface roughness Ra than 0.1 µm and larger in Vickers hardness Hv than 650.

The sealing lip 164c of the annular resilient member 164 may be held in contact with the outer cylindrical surface 151d of the first sealing unit 150 with a vacuum grease constituted by a lubricant containing fluorine. The second sealing unit 160 may include a plurality of sealing rings 163 each having a sealing lip 164c coated with the vacuum grease. The second sealing unit 160 may also include a plurality of sealing rings 163 each having a sealing lip 164c to have the sealing lips 164c collectively form an annular groove filled with the vacuum grease. The second sealing unit 160 may also include a plurality of sealing rings 163 each having a sealing lip 164c and a subsidiary sealing lip held in contact with the outer cylindrical surface 151d of the first sealing unit 150 to have the sealing lip 164c and the subsidiary sealing lip collectively form an annular groove filled with the vacuum grease.

The shaft sealing apparatus 100 further comprises a second bearing 169 intervening between the sleeve shaft 130 and the shaft housing 120 to have the sleeve shaft 130 movably supported by the shaft housing 120 through the second bearing 169. The second bearing 169 is located between the sealing ring 163 of the second sealing unit 160 and the second axial end of the sleeve shaft 130 in axially spaced-apart relationship with the sealing ring 163 of the second sealing unit 160.

The shaft sealing apparatus 100 further comprises second driving means constituted by an electric motor, not shown. The electric motor is operatively connected with the second axial end of the sleeve shaft 130 to rotate the sleeve shaft 130 around its own axis. While the driving means has been described in the above as being constituted by an electric motor operatively connected with the second axial end of the sleeve shaft 130, the electric motor may be replaced by a reduction gear unit and an electric motor operatively connected with the second axial end of the sleeve shaft 130 through the reduction gear unit.

The shaft sealing apparatus 100 further comprises a fixed member 180 in the form of a cylindrical hollow shape and provided on the first axial end 151a of the first sealing unit 150. The fixed member 180 is held in axial alignment with the sleeve shaft 130 and fixedly connected with the first axial end 151a of the first sealing unit 150 by bolts 181. The fixed member 180 projects from the base portion 110a of the vacuum casing 110 and extends in the vacuum chamber 111 of the vacuum casing 110 to be operatively connected with the handling mechanism, not shown. The fixed member 180 forms part of the sleeve shaft 130 extending in the vacuum chamber 111 of the vacuum casing 110.

The shaft sealing apparatus 100 further comprises a base member 190 in the form of a cylindrical shape and provided on the first axial end 140a of the center shaft 140. The base member 190 is held in axial alignment with the center shaft 140 and fixedly connected with the first axial end 140a of the center shaft 140 by bolts 191. The base member 190 projects from the fixed member 180 and extends in the vacuum chamber 111 of the vacuum casing 110 to be operatively connected with the handling mechanism, not shown. The base member 190 forms part of the center shaft 140 extending in the vacuum chamber 111 of the vacuum casing 110.

The handling mechanism is disposed in the vacuum chamber 111 of the vacuum casing 110 and includes a handling member pivotally supported by the fixed member 180 and the base member 190 to be operative to handle wafers and other substrates in the vacuum chamber 111 of the vacuum casing 110.

Figure 3:
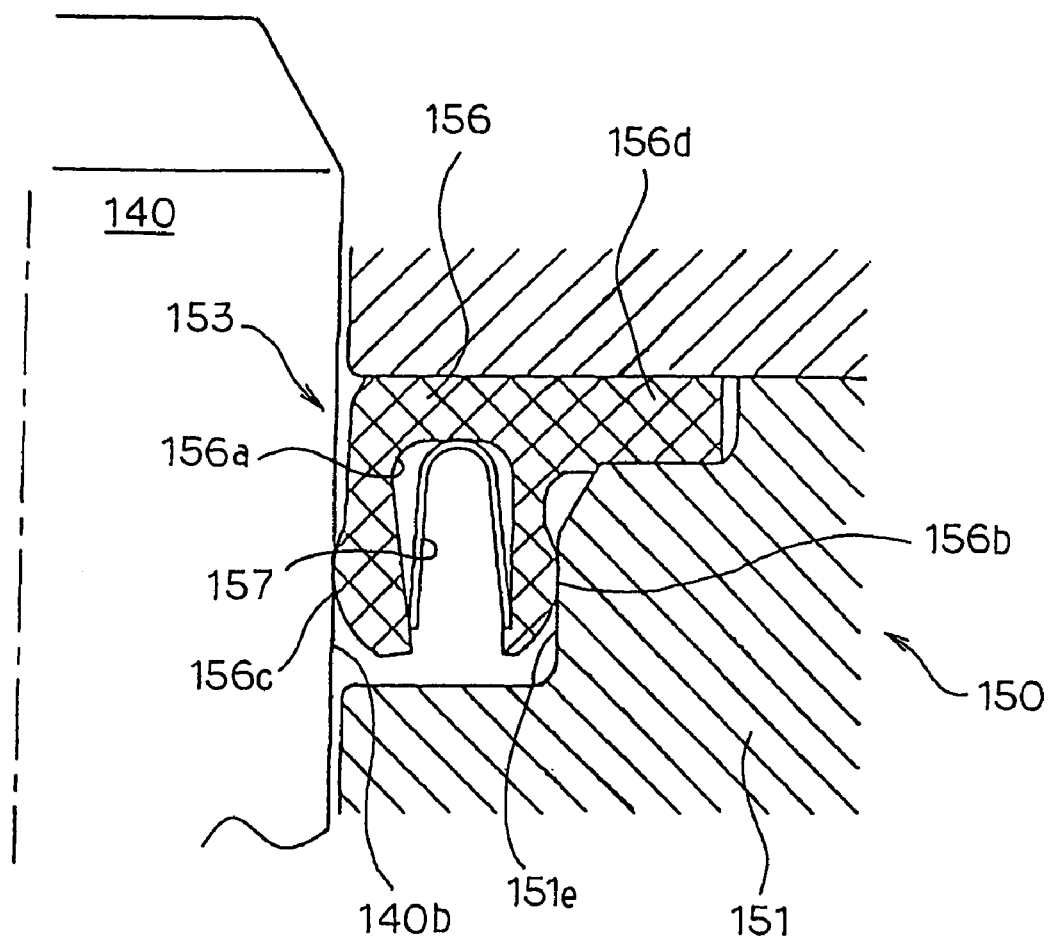
FIG. 3 is an enlarged cross-sectional view similar to FIG. 2 but showing another type of sealing ring forming part of the shaft sealing apparatus shown in FIG. 1.

While the sealing ring 153 has been described in the above as including an annular spring member 155 made of a metal wire in the form of a helical shape as shown in FIG. 2, the annular spring member 155 may be replaced by an annular spring member made of a metal plate in the form of an annular ring shape as shown in FIG. 3 according to the present invention.

As will be seen from FIG. 3, the sealing ring 153 of the first sealing unit 150 includes an annular resilient member 156 formed with an annular groove 156a, and an annular spring member 157 received in the annular groove 156a of the annular resilient member 156 and retained by the annular resilient member 156. The annular resilient member 156 of the sealing ring 153 has a peripheral portion 156b securely retained by the annular ledge 151e of the retaining member 151, and a sealing lip 156c integrally formed with the peripheral portion 156b of the annular resilient member 156 and radially inwardly extending from the peripheral portion 156b of the annular resilient member 156 to be held in contact with the outer cylindrical surface 140b of the center shaft 140. The sealing lip 156c of the annular resilient member 156 is made of a synthetic resin constituted by an ultra high molecular weight compound.

The annular resilient member 156 of the sealing ring 153 may have a flange portion 156d integrally formed with the peripheral portion 156b of the annular resilient member 156 and radially outwardly extending from the peripheral portion 156b of the annular resilient member 156. The flange portion 156d of the annular resilient member 156 is held in contact with the retaining member 151 of the first sealing unit 150 to hermetically seal the gap between the center shaft 140 and the retaining member 151 of the first sealing unit 150.

The annular spring member 157 of the sealing ring 153 is operative to impart a force to the sealing lip 156c of the annular resilient member 156 to ensure that the sealing lip 156c of the annular resilient member 156 is held in tight contact with the outer cylindrical surface 140b of the center shaft 140. The annular spring member 157 of the sealing ring 153 is made of a metal plate in the form of an annular ring shape and is of a channel-shaped cross-section taken on the plane perpendicular to the center axis passing therethrough. The annular spring member 157 thus constructed is generally called "cantilever spring".

Though the sealing ring 163 has been described in the above as including an annular spring member 165 made of a metal wire in the form of a helical shape as shown in FIG. 2, the annular spring member 165 may be also replaced by an annular spring member made of a metal plate in the form of an annular ring shape as shown in FIG. 3 according to the present invention.

While the shaft sealing apparatus 100 has been described in the above as comprising a sleeve shaft 130 rotatably supported by the shaft housing 120 as shown in FIG. 1, the shaft sealing apparatus 100 may further comprise an intermediate shaft housing intervening between the shaft housing 120 and the sleeve shaft 130 according to the present invention. The intermediate shaft housing is axially movably supported by the shaft housing 120 and rotatably supports the sleeve shaft 130 to ensure that the sleeve shaft 130 is rotatable and axially movable with respect to the shaft housing 120. This fact leads to the fact that the second sealing unit 160 intervenes between the vacuum casing 110 and the sleeve shaft 130 to hermetically seal the gap between the vacuum casing 110 and the sleeve shaft 130 under a rotation and a linear motion of the sleeve shaft 130.

Figure 4:
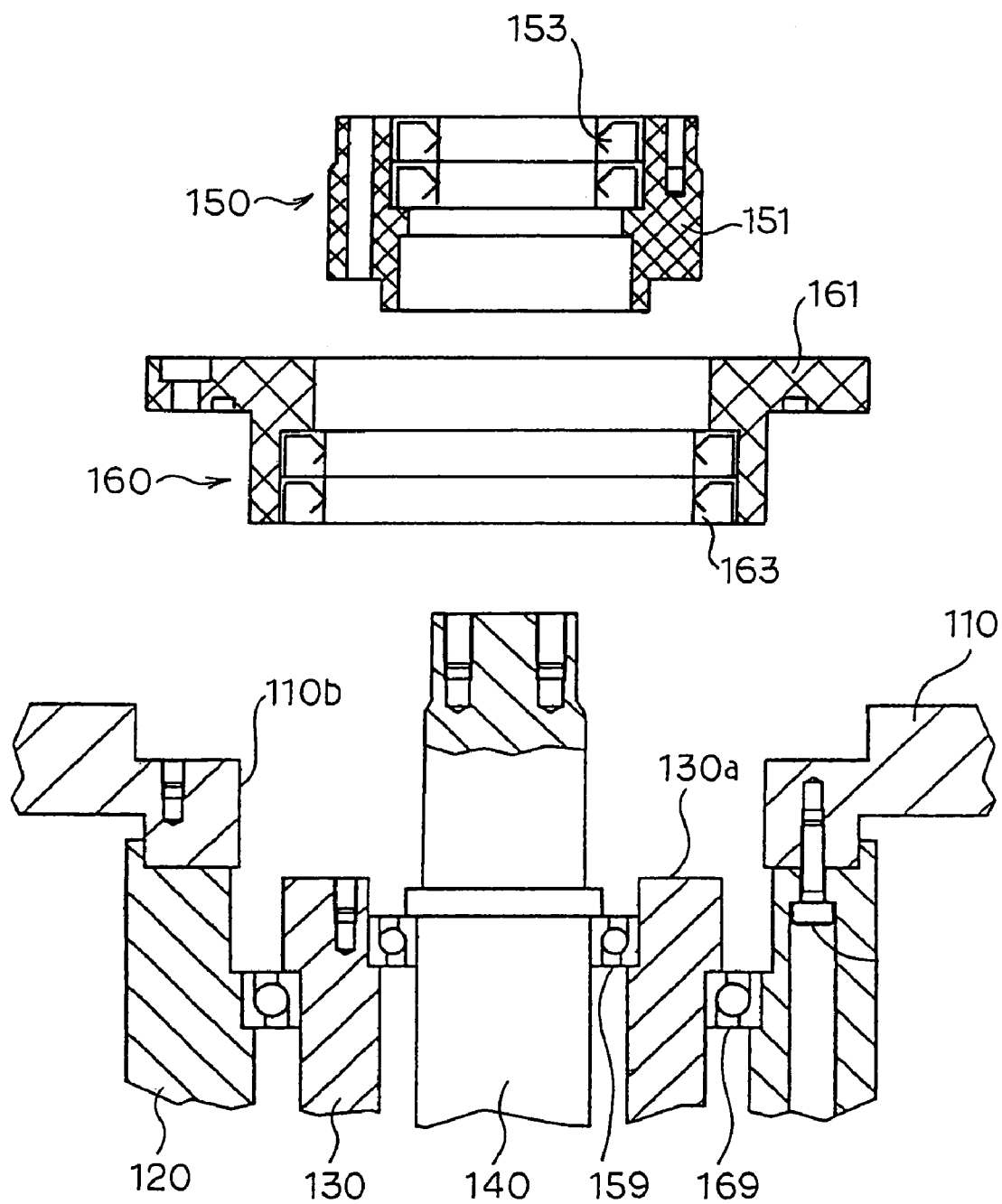
FIG. 4 is a fragmentary cross-sectional view similar to FIG. 1 but showing a preparing step performed by the shaft sealing apparatus shown in FIG. 1.
Figure 5:
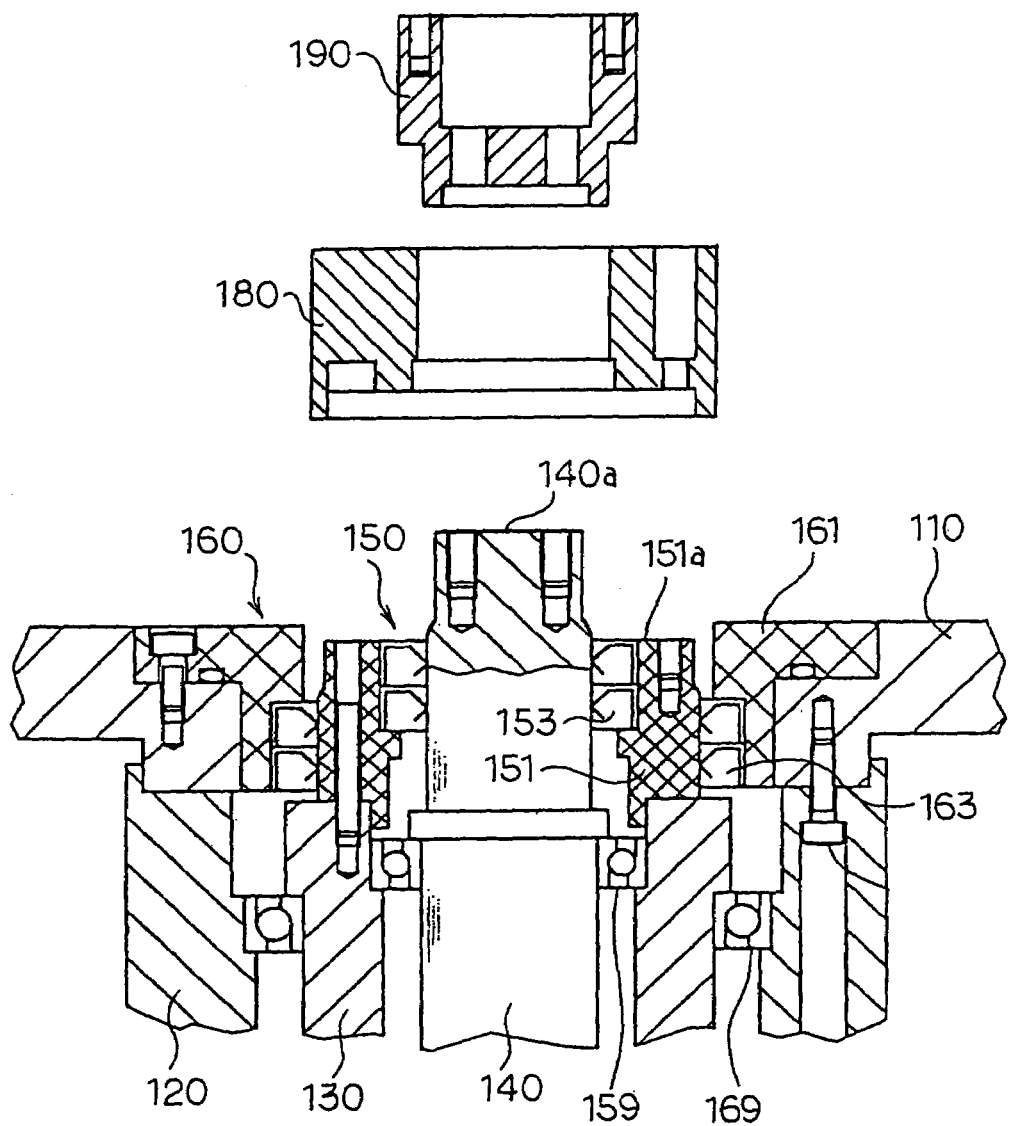
FIG. 5 is a fragmentary cross-sectional view similar to FIG. 4 but showing first and second installing steps performed by the shaft sealing apparatus shown in FIG. 1.

The following description will be directed to a method of assembling the shaft sealing apparatus 100 with reference to the drawings shown in FIGS. 4 and 5. The method of assembling the shaft sealing apparatus 100 is performed through the steps including a preparing step and first to third installing steps as follows.

In the preparing step, the vacuum casing 110, the shaft housing 120, the sleeve shaft 130, the center shaft 140, the first bearing 159, and the second bearing 169 are prepared as a partially assembled unit as shown in FIG. 4. The constructions of the vacuum casing 110, the shaft housing 120, the sleeve shaft 130, the center shaft 140, the first bearing 159, and the second bearing 169 have been described in the above as will be seen in FIG. 1.

In the first installing step, the second sealing unit 160 constituted by the retaining member 161 and the sealing rings 163 securely retained by the retaining member 161 is installed in the opening 110b of the vacuum casing 110 as shown in FIG. 5. The construction of the second sealing unit 160 has been described in the above as will be seen in FIG. 1.

In the second installing step, the first sealing unit 150 constituted by the retaining member 151 and the sealing rings 153 securely retained by the retaining member 151 is installed on the first axial end 130a of the sleeve shaft 130 as shown in FIG. 5. The construction of the first sealing unit 150 has been described in the above as will be seen in FIG. 1.

In the third installing step, the fixed member 180 is installed on the first axial end 151a of the retaining member 151 of the first sealing unit 150, and the base member 190 is installed on the first axial end 140a of the center shaft 140. The constructions of the fixed member 180 and the base member 190 have been described in the above as will be seen in FIG. 1. The shaft sealing apparatus 100 is then assembled as shown in FIG. 1.

As will be seen from the foregoing description, the fact that the outer cylindrical surface of the driving shaft is smaller in surface roughness Ra than 0.1 µm and larger in Vickers hardness Hv than 650 leads to the fact that the first embodiment of the shaft sealing apparatus according to the present invention makes it possible (1) to be excellent in characteristic to seal the gaps between the driving shaft and other parts around the driving shaft within a tolerance (less than $1 \times 10^{-9}$ Pa m$^3$/s). In addition, the fact that the sealing lip of the sealing ring is made of a synthetic resin constituted by an ultra high molecular weight compound leads to the fact that the first embodiment of the shaft sealing apparatus according to the present invention makes it possible (2) to check the flow of gas. Further, the fact that each of the sealing units is installed in the shaft sealing apparatus leads to the fact that the first embodiment of the shaft sealing apparatus according to the present invention makes it possible (3) to be simple in construction, (4) to be reduced in size, (5) to be reduced in production cost, and (6) to be assembled with facility.

While the shaft sealing apparatus 100 has been described in the above as comprising a sleeve shaft 130 received in the shaft housing 120, and a center shaft 140 received in the sleeve shaft 130 as shown in FIG. 1, the sleeve shaft 130 and the center shaft 140 may be replaced by a driving shaft received in the shaft housing 120 according to the present invention.

Figure 6:
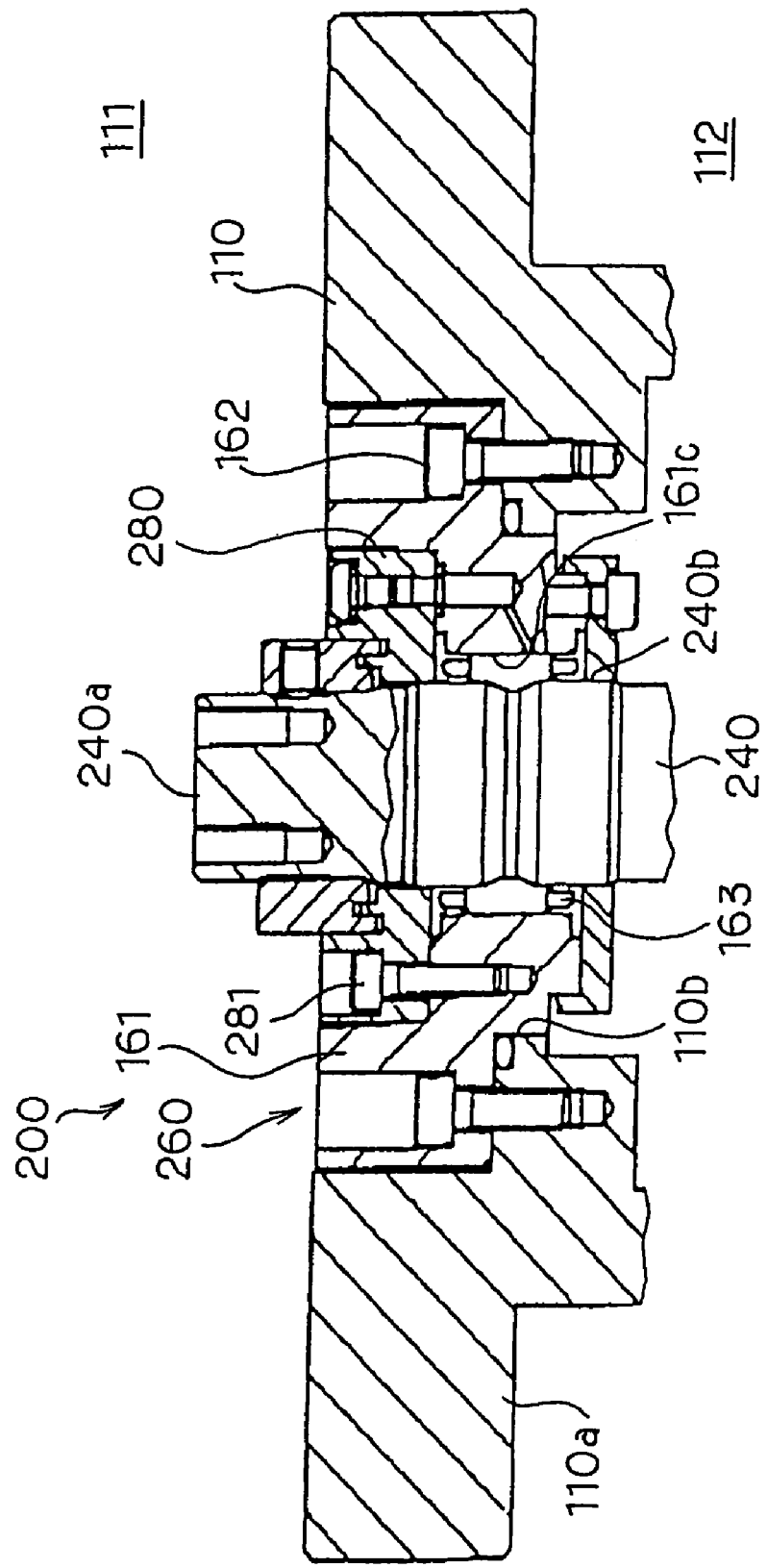
FIG. 6 is a fragmentary cross-sectional view of a second embodiment of the shaft sealing apparatus according to the present invention.

The second embodiment directed to a driving shaft received in the shaft housing 120 is shown in FIG. 6.

In FIG. 6, the shaft sealing apparatus 200 comprises a driving shaft 240 in the form of a cylindrical shape and received in the shaft housing 120, not shown, to be movably supported by the shaft housing 120. The driving shaft 240 is held in coaxial alignment with the shaft housing 120 and rotatable around its own axis with respect to the shaft housing 120. The driving shaft 240 has a first axial end 240a extending in the vacuum chamber 111 of the vacuum casing 110, a second axial end, not shown, extending in the atmosphere 112, and an outer cylindrical surface 240b smaller in diameter than the inner cylindrical surface 120a of the shaft housing 120.

The shaft sealing apparatus 200 further comprises a sealing unit 260 received in the opening 110b of the vacuum casing 110 and fixedly supported by the base portion 110a of the vacuum casing 110. The sealing unit 260 includes a retaining member 161 and a plurality of sealing rings 163. Each of the sealing rings 163 of the sealing unit 260 intervenes between the driving shaft 240 and the retaining member 161 of the sealing unit 260 to hermetically seal the gap between the driving shaft 240 and the retaining member 161 of the sealing unit 260. The sealing rings 163 of the sealing unit 260 are held in axially spaced-apart relationship with each other. The retaining member 161 of the sealing unit 260 has an inner cylindrical surface 161c larger in diameter than the outer cylindrical surface 240b of the driving shaft 240. The sealing lip 164c of the annular resilient member 164 is held in contact with the outer cylindrical surface 240b of the driving shaft 240. The annular spring member 165 of the sealing ring 163 is operative to impart a force to the sealing lip 164c of the annular resilient member 164 to ensure that the sealing lip 164c of the annular resilient member 164 is held in tight contact with the outer cylindrical surface 240b of the driving shaft 240.

In the second embodiment of the shaft sealing apparatus according to the present invention, the outer cylindrical surface 240b of the driving shaft 240 is smaller in surface roughness Ra than 0.1 µm, and larger in Vickers hardness Hv than 650.

The shaft sealing apparatus 200 further comprises a fixed member 280 in the form of an annular ring shape and provided on the retaining member 161 of the sealing unit 260. The fixed member 280 is fixedly connected with the retaining member 161 of the sealing unit 260 by bolts 281.

The above description of the second embodiment has been made only about the driving shaft 240, the sealing unit 260 and the fixed member 280 different from those of the first embodiment, but has not been directed to the vacuum casing 110, the shaft housing 120, the retaining member 161, the sealing ring 163 and the base member 190 which are entirely the same as those of the first embodiment. Detailed description about the vacuum casing 110, the shaft housing 120, the retaining member 161, the sealing ring 163 and the base member 190 will therefore be omitted hereinafter.

The following description will be directed to a method of assembling the shaft sealing apparatus 200 with reference to the drawings shown in FIG. 6. The method of assembling the shaft sealing apparatus 200 is performed through the steps including a preparing step and first and second installing steps as follows.

In the preparing step, the vacuum casing 110, the shaft housing 120, the driving shaft 240 are prepared as a partially assembled unit. The construction of the driving shaft 240 has been described in the above.

In the first installing step, the sealing unit 260 constituted by the retaining member 161 and the sealing rings 163 securely retained by the retaining member 161 is installed in the opening 110b of the vacuum casing 110. The construction of the sealing unit 260 has been described in the above.

In the second installing step, the fixed member 280 is installed on the retaining member 161 of the sealing unit 260. The construction of the fixed member 280 has been described in the above. The shaft sealing apparatus 200 is then assembled as shown in FIG. 6.

It is understood that the second embodiment of the shaft sealing apparatus according to the present invention has an advantage and effect the same as that of the first embodiment of the shaft sealing apparatus according to the present invention.

Figure 7:
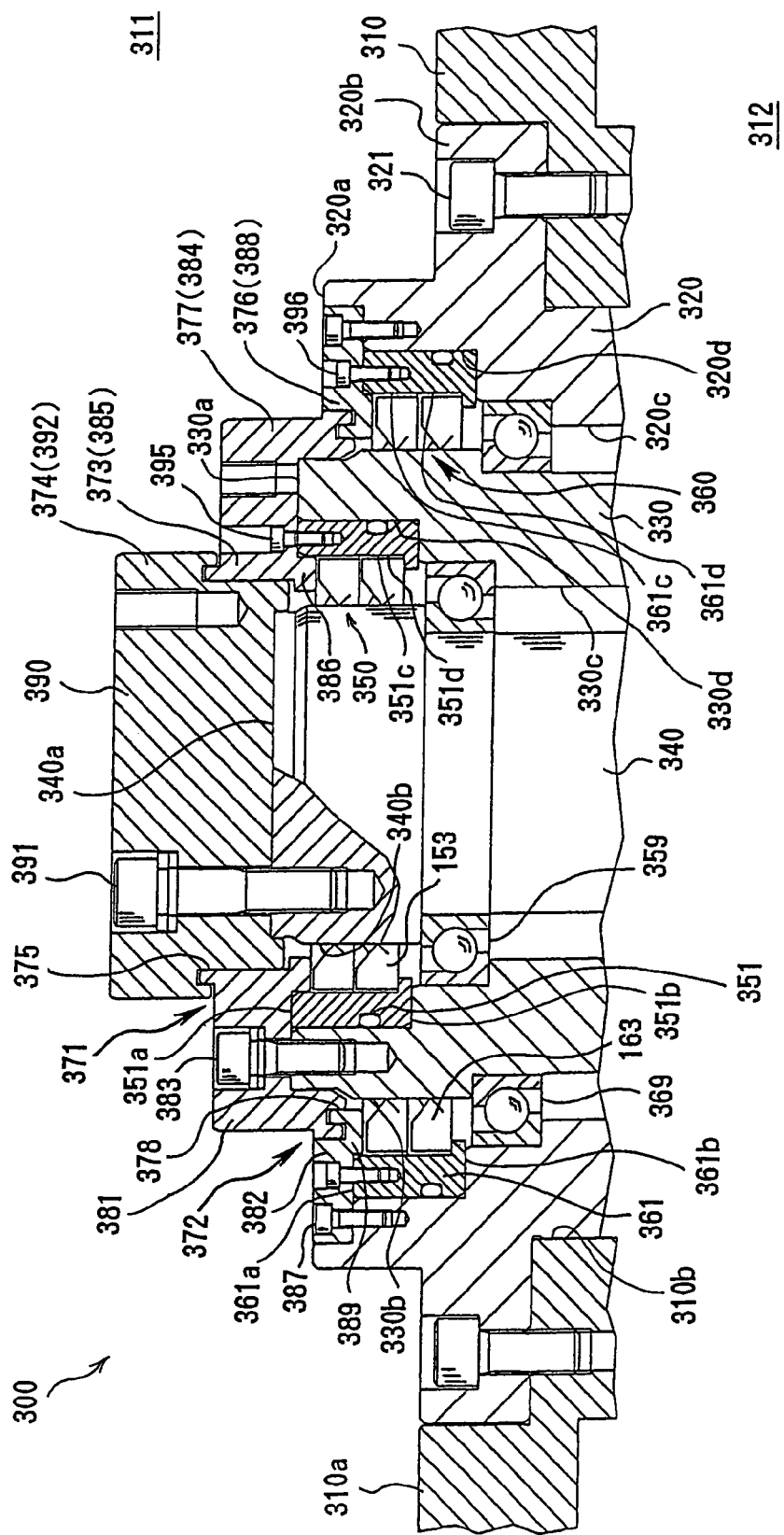
FIG. 7 is a fragmentary cross-sectional view of a third embodiment of the shaft sealing apparatus according to the present invention.

Referring now to the drawings, in particular to FIG. 7, there is shown the third preferred embodiment of the shaft sealing apparatus according to the present invention. The shaft sealing apparatus 300 is available for a vacuum processing apparatus equipped with a handling mechanism. The shaft sealing apparatus 300 comprises a vacuum casing 310 formed with a vacuum chamber 311, and a shaft housing 320 in the form of a cylindrical hollow shape and fixedly connected with the vacuum casing 310. The vacuum casing 310 has a base portion 310a formed with an opening 310b to have the vacuum chamber 311 of the vacuum casing 310 held in communication with the atmosphere 312 through the opening 310b of the vacuum casing 310.

The shaft housing 320 has a first axial end 320a extending in the vacuum chamber 311 of the vacuum casing 310, a second axial end, not shown, extending in the atmosphere 312, a flange portion 320b integrally formed with the first axial end 320a and radially outwardly extending from the first axial end 320a, and an inner cylindrical surface 320c formed with an annular ledge 320d connected with the first axial end 320a. The flange portion 320b of the shaft housing 320 is fixedly connected with the base portion 310a of the vacuum casing 310 by bolts 321. Each of the first axial end 320a of the shaft housing 320 and the flange portion 320b of the shaft housing 320 is exposed to the vacuum chamber 311 of the vacuum casing 310 to form part of the base portion 310a of the vacuum casing 310.

The shaft sealing apparatus 300 further comprises a sleeve shaft 330 in the form of a cylindrical hollow shape and received in the shaft housing 320 to be movably supported by the shaft housing 320. The sleeve shaft 330 is held in coaxial alignment with the shaft housing 320 and rotatable around its own axis with respect to the shaft housing 320. The sleeve shaft 330 has a first axial end 330a extending in the vacuum chamber 311 of the vacuum casing 310, a second axial end, not shown, extending in the atmosphere 312, an outer cylindrical surface 330b smaller in diameter than the inner cylindrical surface 320c of the shaft housing 320, and an inner cylindrical surface 330c formed with an annular ledge 330d connected with the first axial end 330a. The sleeve shaft 330 constitutes a driving shaft having an outer cylindrical surface and movably extending in the vacuum chamber 311 of the vacuum casing 312.

While the shaft sealing apparatus 300 has been described in the above as comprising a sleeve shaft 330 rotatable around its own axis with respect to the shaft housing 320, the sleeve shaft 330 may be replaced by a sleeve shaft axially movable along its own axis with respect to said shaft housing 320 according to the present invention.

Though the shaft sealing apparatus 300 has been described in the above as comprising a sleeve shaft 330 in the form of a cylindrical hollow shape and received in the shaft housing 320 to be held in coaxial alignment with the shaft housing 320, the sleeve shaft 330 may be replaced by a plurality of sleeve shafts each in the form of a cylindrical hollow shape and received in the shaft housing 320 to be held in coaxial alignment with the shaft housing 320 according to the present invention.

The shaft sealing apparatus 300 further comprises a center shaft 340 in the form of a cylindrical shape and received in the sleeve shaft 330 to be movably supported by the sleeve shaft 330. The center shaft 340 is held in coaxial alignment with the sleeve shaft 330 and rotatable around its own axis with respect to the sleeve shaft 330. The center shaft 340 has a first axial end 340a extending in the vacuum chamber 311 of the vacuum casing 310, a second axial end, not shown, extending in the atmosphere 312, and an outer cylindrical surface 340b smaller in diameter than the inner cylindrical surface 330c of the sleeve shaft 330. The center shaft 340 constitutes a driving shaft having an outer cylindrical surface and movably extending in the vacuum chamber 311 of the vacuum casing 312.

While the shaft sealing apparatus 300 has been described in the above as comprising a center shaft 340 rotatable around its own axis with respect to the sleeve shaft 330, the center shaft 340 may be replaced by a center shaft axially movable along its own axis with respect to said sleeve shaft 330 according to the present invention.

The shaft sealing apparatus 300 further comprises a first sealing unit 350 received in the annular ledge 330d of the sleeve shaft 330 and fixedly supported by the sleeve shaft 330. The first sealing unit 350 includes a retaining member 351 in the form of an annular ring shape and fixedly supported by the sleeve shaft 330, and a plurality of sealing rings 153 securely retained by the retaining member 351 of the first sealing unit 350 to be held in axial alignment with each other. Each of the sealing rings 153 of the first sealing unit 350 is in the form of an annular ring shape and intervenes between the center shaft 340 and the retaining member 351 of the first sealing unit 350 to hermetically seal the gap between the center shaft 340 and the retaining member 351 of the first sealing unit 350. The sealing rings 153 of the first sealing unit 350 are held in contact with each other.

The retaining member 351 of the first sealing unit 350 has a first axial end 351a extending in the vacuum chamber 311 of the vacuum casing 310, a second axial end 351b held in contact with the annular ledge 330d of the sleeve shaft 330, and an inner cylindrical surface 351c larger in diameter than the outer cylindrical surface 340b of the center shaft 340. The inner cylindrical surface 351c of the retaining member 351 is formed with an annular ledge 351d connected with the first axial end 351a of the retaining member 351.

Each of the sealing rings 153 of the first sealing unit 350 includes an annular resilient member 154 formed with an annular groove 154a, and an annular spring member 155 received in the annular groove 154a of the annular resilient member 154 and retained by the annular resilient member 154 as shown in FIG. 2. The annular resilient member 154 of the sealing ring 153 has a peripheral portion 154b securely retained by the annular ledge 351d of the retaining member 351, and a sealing lip 154c integrally formed with the peripheral portion 154b of the annular resilient member 154 and radially inwardly extending from the peripheral portion 154b of the annular resilient member 154 to be held in contact with the outer cylindrical surface 340b of the center shaft 340. The sealing lip 154c of the annular resilient member 154 is made of a synthetic resin constituted by an ultra high molecular weight compound.

The annular resilient member 154 of the sealing ring 153 may have a reinforcing portion 154d covered by a rubber and intervening between the peripheral portion 154b of the annular resilient member 154 and the sealing lip 154c of the annular resilient member 154 to have the resilient member 154 reinforced with the annular reinforcing portion 154d. The reinforcing portion 154d of the annular resilient member 154 is made of a metal plate in the form of an annular ring shape and is of an L-shaped cross-section taken on the plane perpendicular to the center axis passing therethrough.

The annular spring member 155 of the sealing ring 153 is operative to impart a force to the sealing lip 154c of the annular resilient member 154 to ensure that the sealing lip 154c of the annular resilient member 154 is held in tight contact with the outer cylindrical surface 340b of the center shaft 340. The annular spring member 155 of the sealing ring 153 is made of a metal wire in the form of a helical shape and is of a circular cross-section taken on the plane perpendicular to the center axis passing therethrough. The annular spring member 155 thus constructed is generally called "garter spring".

In the third embodiment of the shaft sealing apparatus according to the present invention, the outer cylindrical surface 340b of the center shaft 340 is smaller in surface roughness Ra than 0.1 µm and larger in Vickers hardness Hv than 650.

The sealing lip 154c of the annular resilient member 154 may be held in contact with the outer cylindrical surface 340b of the center shaft 340 with a vacuum grease constituted by a lubricant containing fluorine. The first sealing unit 350 may include a plurality of sealing rings 153 each having a sealing lip 154c coated with the vacuum grease. The first sealing unit 350 may also include a plurality of sealing rings 153 each having a sealing lip 154c to have the sealing lips 154c collectively form an annular groove filled with the vacuum grease. The first sealing unit 350 may also include a plurality of sealing rings 153 each having a sealing lip 154c and a subsidiary sealing lip held in contact with the outer cylindrical surface 340b of the center shaft 340 to have the sealing lip 154c and the subsidiary sealing lip collectively form an annular groove filled with the vacuum grease.

The shaft sealing apparatus 300 further comprises a first bearing 359 intervening between the center shaft 340 and the sleeve shaft 330 to have the center shaft 340 movably supported by the sleeve shaft 330 through the first bearing 359. The first bearing 359 is located between the sealing ring 153 of the first sealing unit 350 and the second axial end of the center shaft 340 in axially spaced-apart relationship with the sealing ring 153 of the first sealing unit 350.

The shaft sealing apparatus 300 further comprises first driving means constituted by an electric motor, not shown. The electric motor is operatively connected with the second axial end of the center shaft 340 to rotate the center shaft 340 around its own axis. While the driving means has been described in the above as being constituted by an electric motor operatively connected with the second axial end of the center shaft 340, the electric motor may be replaced by a reduction gear unit and an electric motor operatively connected with the second axial end of the center shaft 340 through the reduction gear unit.

The shaft sealing apparatus 300 further comprises a second sealing unit 360 received in the annular ledge 320d of the shaft housing 320 and fixedly supported by the shaft housing 320. The second sealing unit 360 includes a retaining member 361 in the form of an annular ring shape and fixedly supported by the shaft housing 320, and a plurality of sealing rings 163 securely retained by the retaining member 361 of the second sealing unit 360 to be held in axial alignment with each other. Each of the sealing rings 163 of the second sealing unit 360 is in the form of an annular ring shape and intervenes between the sleeve shaft 330 and the retaining member 361 of the second sealing unit 360 to hermetically seal the gap between the sleeve shaft 330 and the retaining member 361 of the second sealing unit 360. The sealing rings 163 of the second sealing unit 360 are held in contact with each other.

The retaining member 361 of the second sealing unit 360 has a first axial end 361a extending in the vacuum chamber 311 of the vacuum casing 310, a second axial end 361b held in contact with the annular ledge 320d of the shaft housing 320, and an inner cylindrical surface 361c larger in diameter than the outer cylindrical surface 351d of the sleeve shaft 330. The inner cylindrical surface 361c of the retaining member 361 is formed with an annular ledge 361d connected with the first axial end 361a of the retaining member 361.

Each of the sealing ring 163 of the second sealing unit 360 includes an annular resilient member 164 formed with an annular groove 164a, and an annular spring member 165 received in the annular groove 164a of the annular resilient member 164 and retained by the annular resilient member 164 as shown in The annular resilient member 164 of the sealing ring 163 has a peripheral portion 164b securely retained by the annular ledge 361d of the retaining member 361, and a sealing lip 164c integrally formed with the peripheral portion 164b of the annular resilient member 164 and radially inwardly extending from the peripheral portion 164b of the annular resilient member 164 to be held in contact with the outer cylindrical surface 330b of the sleeve shaft 330. The sealing lip 164c of the annular resilient member 164 is made of a synthetic resin constituted by an ultra high molecular weight compound.

The annular resilient member 164 of the sealing ring 163 may have a reinforcing portion 164d covered by a rubber and intervening between the peripheral portion 164b of the annular resilient member 164 and the sealing lip 164c of the annular resilient member 164 to have the annular resilient member 164 reinforced with the reinforcing portion 164d. The reinforcing portion 164d of the annular resilient member 164 is made of a metal plate in the form of an annular ring shape and is of an L-shaped cross-section taken on the plane perpendicular to the center axis passing therethrough.

The annular spring member 165 of the sealing ring 163 is operative to impart a force to the sealing lip 164c of the annular resilient member 164 to ensure that the sealing lip 164c of the annular resilient member 164 is held in tight contact with the outer cylindrical surface 330b of the sleeve shaft 330. The annular spring member 165 of the sealing ring 163 is made of a metal wire in the form of a helical shape and is of a circular cross-section taken on the plane perpendicular to the center axis passing therethrough. The annular spring member 165 thus constructed is generally called "garter spring".

In the third embodiment of the shaft sealing apparatus according to the present invention, the outer cylindrical surface 330b of the sleeve shaft 330 is smaller in surface roughness Ra than 0.1 µm and larger in Vickers hardness Hv than 650.

The sealing lip 164c of the annular resilient member 164 may be held in contact with the outer cylindrical surface 330b of the sleeve shaft 330 with a vacuum grease constituted by a lubricant containing fluorine. The second sealing unit 360 may include a plurality of sealing rings 163 each having a sealing lip 164c coated with the vacuum grease. The second sealing unit 360 may also include a plurality of sealing rings 163 each having a sealing lip 164c to have the sealing lips 164c collectively form an annular groove filled with the vacuum grease. The second sealing unit 360 may also include a plurality of sealing rings 163 each having a sealing lip 164c and a subsidiary sealing lip held in contact with the outer cylindrical surface 330b of the sleeve shaft 330 to have the sealing lip 164c and the subsidiary sealing lip collectively form an annular groove filled with the vacuum grease.

The shaft sealing apparatus 300 further comprises a second bearing 369 intervening between the sleeve shaft 330 and the shaft housing 320 to have the sleeve shaft 330 movably supported by the shaft housing 320 through the second bearing 369. The second bearing 369 is located between the sealing ring 163 of the second sealing unit 360 and the second axial end of the sleeve shaft 330 in axially spaced-apart relationship with the sealing ring 163 of the second sealing unit 360.

The shaft sealing apparatus 300 further comprises second driving means constituted by an electric motor, not shown. The electric motor is operatively connected with the second axial end of the sleeve shaft 330 to rotate the sleeve shaft 330 around its own axis. While the driving means has been described in the above as being constituted by an electric motor operatively connected with the second axial end of the sleeve shaft 330, the electric motor may be replaced by a reduction gear unit and an electric motor operatively connected with the second axial end of the sleeve shaft 330 through the reduction gear unit.

The shaft sealing apparatus 300 further comprises a first labyrinth seal unit 371 intervening between the sleeve shaft 330 and the center shaft 340 to be exposed to the vacuum chamber 311 of the vacuum casing 310, and a second labyrinth seal unit 372 intervening between the shaft housing 320 and the sleeve shaft 330 to be exposed to the vacuum chamber 311 of the vacuum casing 310. The first labyrinth seal unit 371 includes an outer ring member 373 provided on the first axial end 330a of the sleeve shaft 330, and an inner ring member 374 provided on the first axial end 340a of the center shaft 340. The outer and inner ring members 373 and 374 of the first labyrinth seal unit 371 collectively form an interstice 375 therebetween to be operative to prevent dust, oil and gas from passing through the interstice 375 of the first labyrinth seal unit 371. The second labyrinth seal unit 372 includes an outer ring member 376 provided on the first axial end 320a of the shaft housing 320, and an inner ring member 377 provided on the first axial end 330a of the sleeve shaft 330. The outer and inner ring members 376 and 377 of the second labyrinth seal unit 372 collectively form an interstice 378 therebetween to be operative to prevent dust, oil and gas from passing through the interstice 378 of the second labyrinth seal unit 372.

The shaft sealing apparatus 300 further comprises a first fixed member 381 in the form of an annular ring shape and provided on the first axial end 330a of the sleeve shaft 330, a second fixed member 382 in the form of an annular ring shape and provided on the first axial end 320a of the shaft housing 320, and a base member 390 in the form of a circular shape and provided on the first axial end 340a of the center shaft 340.

The second fixed member 382 is held in axial alignment with the shaft housing 320 and fixedly connected with the first axial end 320a of the shaft housing 320 by bolts 387. The second fixed member 382 has an inner portion 388 formed with a projection, and a flange portion 389 operative to prevent the sealing rings 163 of the second sealing unit 360 from moving toward the vacuum chamber 311 of the vacuum casing 310 with respect to the sleeve shaft 330. The inner portion 388 of the second fixed member 382 constitutes the outer ring member 376 of the second labyrinth seal unit 372.

The second fixed member 382 projects from the base portion 310a of the vacuum casing 310 and extends in the vacuum chamber 311 of the vacuum casing 310. The second fixed member 382 forms part of the shaft housing 320 extending in the vacuum chamber 311 of the vacuum casing 310. The second fixed member 382 is fixedly connected with the retaining member 361 of the second sealing unit 360 by bolts 396 to be operative to prevent the retaining member 361 of the second sealing unit 360 from rotating around its own axis with respect to the shaft housing 320.

The first fixed member 381 is held in axial alignment with the sleeve shaft 330 and fixedly connected with the first axial end 330a of the sleeve shaft 330 by bolts 383. The first fixed member 381 has an outer portion 384 formed with a pit to fit with the projection of the inner portion 388 of the second fixed member 382, an inner portion 385 formed with a projection, and a flange portion 386 operative to prevent the sealing rings 153 of the first sealing unit 350 from moving toward the vacuum chamber 311 of the vacuum casing 310 with respect to the center shaft 340. The outer portion 384 of the first fixed member 381 constitutes the inner ring member 377 of the second labyrinth seal unit 372. The inner portion 385 of the first fixed member 381 constitutes the outer ring member 373 of the first labyrinth seal unit 371.

The first fixed member 381 projects from the first axial end 320a of the shaft housing 320 and extends in the vacuum chamber 311 of the vacuum casing 310 to be operatively connected with the handling mechanism, not shown. The first fixed member 381 forms part of the sleeve shaft 330 extending in the vacuum chamber 311 of the vacuum casing 310. The first fixed member 381 is fixedly connected with the retaining member 351 of the first sealing unit 350 by bolts 395 to be operative to prevent the retaining member 351 of the first sealing unit 350 from rotating around its own axis with respect to the sleeve shaft 330.

The base member 390 is held in axial alignment with the center shaft 340 and fixedly connected with the first axial end 340a of the center shaft 340 by bolts 391. The base member 390 has an outer portion 392 formed with a pit to fit with the projection of the inner portion 385 of the first fixed member 381. The base member 390 projects from the first axial end 330a of the sleeve shaft 330 and extends in the vacuum chamber 311 of the vacuum casing 310 to be operatively connected with the handling mechanism, not shown. The base member 390 forms part of the center shaft 340 extending in the vacuum chamber 311 of the vacuum casing 310. The outer portion 392 of the base member 390 constitutes the inner ring member 374 of the first labyrinth seal unit 371.

In the third embodiment of the shaft sealing apparatus according to the present invention, the base member 390 and the first fixed member 381 collectively constitute the first labyrinth seal unit 371, and the first and second fixed members 381 and 382 collectively constitute the second labyrinth seal unit 372.

The handling mechanism is disposed in the vacuum chamber 311 of the vacuum casing 310 and includes a handling member pivotally supported by the first fixed member 381 and the base member 390 to be operative to handle wafers and other substrates in the vacuum chamber 311 of the vacuum casing 310.

While the sealing ring 153 has been described in the above as including an annular spring member 155 made of a metal wire in the form of a helical shape as shown in FIG.

2, the annular spring member 155 may be replaced by an annular spring member made of a metal plate in the form of an annular ring shape as shown in FIG. 3 according to the present invention.

As will be seen from FIG. 3, the sealing ring 153 of the first sealing unit 350 includes an annular resilient member 156 formed with an annular groove 156a, and an annular spring member 157 received in the annular groove 156a of the annular resilient member 156 and retained by the annular resilient member 156. The annular resilient member 156 of the sealing ring 153 has a peripheral portion 156b securely retained by the annular ledge 351d of the retaining member 351, and a sealing lip 156c integrally formed with the peripheral portion 156b of the annular resilient member 156 and radially inwardly extending from the peripheral portion 156b of the annular resilient member 156 to be held in contact with the outer cylindrical surface 340b of the center shaft 340. The sealing lip 156c of the annular resilient member 156 is made of a synthetic resin constituted by an ultra high molecular weight compound.

The annular resilient member 156 of the sealing ring 153 may have a flange portion 156d integrally formed with the peripheral portion 156b of the annular resilient member 156 and radially outwardly extending from the peripheral portion 156b of the annular resilient member 156. The flange portion 156d of the annular resilient member 156 is held in contact with the retaining member 351 of the first sealing unit 350 to hermetically seal the gap between the center shaft 340 and the retaining member 351 of the first sealing unit 350.

The annular spring member 157 of the sealing ring 153 is operative to impart a force to the sealing lip 156c of the annular resilient member 156 to ensure that the sealing lip 156c of the annular resilient member 156 is held in tight contact with the outer cylindrical surface 340b of the center shaft 340. The annular spring member 157 of the sealing ring 153 is made of a metal plate in the form of an annular ring shape and is of a channel-shaped cross-section taken on the plane perpendicular to the center axis passing therethrough. The annular spring member 157 thus constructed is generally called "cantilever spring".

Though the sealing ring 163 has been described in the above as including an annular spring member 165 made of a metal wire in the form of a helical shape as shown in FIG. 2, the annular spring member 165 may be also replaced by an annular spring member made of a metal plate in the form of an annular ring shape as shown in FIG. 3 according to the present invention.

While the shaft sealing apparatus 300 has been described in the above as comprising a sleeve shaft 330 rotatably supported by the shaft housing 320 as shown in FIG. 7, the shaft sealing apparatus 300 may further comprise an intermediate shaft housing intervening between the shaft housing 320 and the sleeve shaft 330 according to the present invention. The intermediate shaft housing is axially movably supported by the shaft housing 320 and rotatably supports the sleeve shaft 330 to ensure that the sleeve shaft 330 is rotatable and axially movable with respect to the shaft housing 320. This fact leads to the fact that the second sealing unit 360 intervenes between the vacuum casing 310 and the sleeve shaft 330 to hermetically seal the gap between the vacuum casing 310 and the sleeve shaft 330 under a rotation and a linear motion of the sleeve shaft 330.

The following description will be directed to a method of assembling the shaft sealing apparatus 300 with reference to the drawing shown in FIG. 7. The method of assembling the shaft sealing apparatus 300 is performed through the steps including a preparing step and first to third installing steps as follows.

In the preparing step, the vacuum casing 310, the shaft housing 320, the sleeve shaft 330, the center shaft 340, the first bearing 359, and the second bearing 369 are prepared as a partially assembled unit. The constructions of the vacuum casing 310, the shaft housing 320, the sleeve shaft 330, the center shaft 340, the first bearing 359, and the second bearing 369 have been described in the above.

In the first installing step, the first sealing unit 350 constituted by the retaining member 351 and the sealing rings 153 securely retained by the retaining member 351 is installed in the annular ledge 330d of the shaft housing 330, and the second sealing unit 360 constituted by the retaining member 361 and the sealing rings 163 securely retained by the retaining member 361 is installed in the annular ledge 320d of the shaft housing 320. The constructions of the first and second sealing units 350 and 360 have been described in the above.

In the second installing step, the second fixed member 382 is installed on the first axial end 320a of the shaft housing 320, and the first fixed member 381 is installed on the first axial end 330a of the sleeve shaft 330. The second labyrinth seal unit 372 is then installed between the shaft housing 320 and the sleeve shaft 330 to be exposed to the vacuum chamber 311 of the vacuum casing 310. The constructions of the first and second fixed members 381 and 382, and the second labyrinth seal unit 372 have been described in the above.

In the third installing step, the base member 390 is installed on the first axial end 340a of the center shaft 340. The first labyrinth seal unit 371 is then installed between the sleeve shaft 330 and the center shaft 340 to be exposed to the vacuum chamber 311 of the vacuum casing 310. The constructions of the base member 390 and the first labyrinth seal unit 371 have been described in the above. The shaft sealing apparatus 300 is then assembled as shown in FIG. 7.

As will be seen from the foregoing description, the fact that the outer cylindrical surface of the driving shaft is smaller in surface roughness Ra than 0.1 μm and larger in Vickers hardness Hv than 650 leads to the fact that the third embodiment of the shaft sealing apparatus according to the present invention makes it possible (1) to be excellent in characteristic to seal the gaps between the driving shaft and other parts around the driving shaft within a tolerance (less than $1 \times 10^{-9}$ Pa m$^3$/s). In addition, the fact that the sealing lip of the sealing ring is made of a synthetic resin constituted by an ultra high molecular weight compound leads to the fact that the third embodiment of the shaft sealing apparatus according to the present invention makes it possible (2) to check the flow of gas. Further, the fact that each of the sealing units is installed in the shaft sealing apparatus separately leads to the fact that the third embodiment of the shaft sealing apparatus according to the present invention makes it possible (3) to be simple in construction, (4) to be reduced in size, (5) to be reduced in production cost, (6) to be assembled with facility, (7) to eliminate the need of centering of the sealing unit, and (8) to prevent the sealing lip from breaking. Further, the fact that each of the labyrinth seal units is installed in the shaft sealing apparatus leads to the fact that the third embodiment of the shaft sealing apparatus according to the present invention makes it possible (9) to prevent dust, oil and gas from passing through the interstice of the labyrinth seal unit. Further, the fact that each of the base member and the first fixed member collectively constitute the first labyrinth seal unit, and the first and second fixed members collectively constitute the second labyrinth seal unit leads to the fact that the third embodiment of the shaft sealing apparatus according to the present invention makes it possible (10) to be reduced in parts count, and (11) to be reduced in size.

What is claimed is:

1. A shaft sealing assembly for use in a vacuum processing apparatus, comprising:
    a vacuum casing formed therein with a vacuum chamber maintained at a high pressure level less than $10^{-1}$ Pa, said vacuum casing having a base portion formed with an opening wherein said opening provides communication between said vacuum chamber and the atmosphere;
    a driving shaft having an outer cylindrical surface and movably extending in said vacuum chamber of said vacuum casing through said opening of said vacuum casing; and
    a sealing ring in the form of an annular ring shape, received in said opening of said vacuum chamber and including a sealing lip held in contact with said outer cylindrical surface of said driving shaft and formed with an annular groove, an annular spring member received in said annular groove of said sealing lip and operative to impart a force to said sealing lip to ensure that said sealing lip is held in tight contact with said outer cylindrical surface of said driving shaft, and a peripheral portion radially outwardly extending from said sealing lip and fixedly connected with said base portion of said vacuum casing, in which said outer cylindrical surface of said driving shaft is smaller in surface roughness Ra than 0.1 (μm) and the gap between said outer cylindrical surface of said driving shaft and said sealing lip of said sealing ring is sealed within a tolerance less than $1 \times 10^{-9}$ Pa m$^3$/s.

2. A shaft sealing assembly as set forth in claim 1, in which said outer cylindrical surface of said driving shaft is larger in Vickers hardness Hv than 650.

3. A shaft sealing assembly as set forth in claim 1, in which said annular spring member of said sealing ring is made of a metal wire in the form of a helical shape and is of a circular cross-section taken on the plane perpendicular to the center axis passing therethrough.

4. A shaft sealing assembly as set forth in claim 1, in which said annular spring member of said sealing ring is made of a metal plate in the form of an annular ring shape and is of a channel-shaped cross-section taken on the plane perpendicular to the center axis passing therethrough.

5. A shaft sealing assembly as set forth in claim 1, in which said sealing lip of said sealing ring is made of a synthetic resin constituted by an ultra high molecular weight compound.

6. A shaft sealing assembly for use in a vacuum processing apparatus, comprising:
    a vacuum casing formed with a vacuum chamber maintained at a high pressure level less than $10^{-1}$ Pa and having a base portion formed with an opening to have said vacuum chamber of said vacuum casing held in communication with the atmosphere through said opening of said vacuum casing;
    a shaft housing in the form of a cylindrical hollow shape and fixedly with said base portion of said vacuum casing, said shaft housing having an inner cylindrical surface;
    a driving shaft in the form of a cylindrical shape and received in said shaft housing to be movably supported by said shaft housing, said driving shaft held in coaxial alignment with said shaft housing and having a first axial end extending in said vacuum chamber of said vacuum casing, a second axial end extending in the atmosphere, and an outer cylindrical surface smaller in diameter than said inner cylindrical surface of said shaft housing; and
    a sealing unit received in said opening of said vacuum casing and fixedly supported by said base portion of said vacuum casing, said sealing unit including a retaining member in the form of an annular ring shape and fixedly connected with said base portion of said vacuum casing, and a sealing ring in the form of an annular ring shape and securely retained by said retaining member of said sealing unit, said sealing ring of said sealing unit intervening between said driving shaft and said retaining member of said sealing unit to hermetically seal the gap between said driving shaft and said retaining member of said sealing unit, said sealing ring of said sealing unit including an annular resilient member formed with an annular groove, and an annular spring member received in said annular groove of said annular resilient member and retained by said annular resilient member, said annular resilient member of said sealing ring having a peripheral portion securely retained by said retaining member, and a sealing lip integrally formed with said peripheral portion of said annular resilient member and radially inwardly extending from said peripheral portion of said annular resilient member to be held in contact with said outer cylindrical surface of said driving shaft, said annular spring member of said sealing ring operative to impart a force to said sealing lip of said annular resilient member to ensure that said sealing lip of said annular resilient member is held in tight contact with said outer cylindrical surface of said driving shaft in which said outer cylindrical surface of said driving shaft is smaller in surface roughness Ra than 0.1 (μm) and the gap between said driving shaft and said retaining member of said sealing unit is sealed within a tolerance less than $1 \times 10^{-9}$ Pa m$^3$/s.

7. A shaft sealing assembly as set forth in claim 6, in which said driving shaft is rotatable around its own axis with respect to said shaft housing.

8. A shaft sealing assembly as set forth in claim 6, in which said driving shaft is axially movable along its own axis with respect to said shaft housing.

9. A shaft sealing assembly for use in a vacuum processing apparatus, comprising:
    a vacuum casing formed with a vacuum chamber maintained at a high pressure level less than $10^{-1}$ Pa and having a base portion formed with an opening to have said vacuum chamber of said vacuum casing held in communication with the atmosphere through said opening of said vacuum casing;
    a shaft housing in the form of a cylindrical hollow shape and fixedly connected with said base portion of said vacuum casing, said shaft housing having an inner cylindrical surface;
    a sleeve shaft in the form of a cylindrical hollow shape and received in said shaft housing to be movably supported by said shaft housing, said sleeve shaft held in coaxial alignment with said shaft housing and having a first axial end extending in said vacuum chamber of said vacuum casing, a second axial end extending in the atmosphere, an outer cylindrical surface smaller in diameter than said inner cylindrical surface of said shaft housing, and an inner cylindrical surface;

a center shaft in the form of a cylindrical shape and received in said sleeve shaft to be movably supported by said sleeve shaft, said center shaft held in coaxial alignment with said sleeve shaft and having a first axial end extending in said vacuum chamber of said vacuum casing, a second axial end extending in the atmosphere, and an outer cylindrical surface smaller in diameter than said inner cylindrical surface of said sleeve shaft;

a first sealing unit provided on said first axial end of said sleeve shaft and held in coaxial alignment with said sleeve shaft, said fast sealing unit including a retaining member in the form of an annular ring shape and fixedly connected with said first axial end of said sleeve shaft, and a sealing ring in the form of an annular ring shape and securely retained by said retaining member of said first sealing unit, said sealing ring of said first sealing unit intervening between said center shaft and said retaining member of said first sealing unit to hermetically seal the gap between said center shaft and said retaining member of said first sealing unit, said sealing ring of said first sealing unit including an annular resilient member formed with an annular groove, and an annular spring member received in said annular groove of said annular resilient member and retained by said annular resilient member, said annular resilient member of said sealing ring having a peripheral portion securely retained by said retaining member, and a sealing lip integrally formed with said peripheral portion of said annular resilient member and radially inwardly extending from said peripheral portion of said annular resilient member to be held in contact with said outer cylindrical surface of said center shaft, said annular spring member of said sealing ring operative to impart a force to said sealing lip of said annular resilient member to ensure that said sealing lip of said annular resilient member is held in tight contact with said outer cylindrical surface of said center shaft; and a second sealing unit received in said opening of said vacuum casing and fixedly supported by said base portion of said vacuum casing, said second sealing unit including a retaining member in the form of an annular ring shape and fixedly connected with said base portion of said vacuum casing, and a sealing ring in the form of an annular ring shape and securely retained by said retaining member of said second sealing unit, said sealing ring of said second sealing unit intervening between said retaining member of said first sealing unit and said retaining member of said second sealing unit to hermetically seal the gap between said retaining member of said first sealing unit and said retaining member of said second sealing unit, said sealing ring of said second sealing unit including an annular resilient member formed with an annular groove, and an annular spring member received in said annular groove of said annular resilient member and retained by said annular resilient member, said annular resilient member of said sealing ring having a peripheral portion securely retained by said retaining member, and a sealing lip integrally formed with said peripheral portion of said annular resilient member and radially inwardly extending from said peripheral portion of said annular resilient member to be held in contact with said outer cylindrical surface of said first sealing unit, said annular spring member of said sealing ring operative to impart a force to said sealing lip of said annular resilient member to ensure that said sealing lip of said annular resilient member is held in tight contact with said outer cylindrical surface of said first sealing unit in which said outer cylindrical surface of said center shaft is smaller in surface roughness Ra than 0.1 ($\mu$m) and the gap between said center shaft and said retaining member of said first sealing unit is sealed within a tolerance less than $1 \times 10^{-9}$ Pa m$^3$/s and said outer cylindrical surface of said retaining member of said first sealing unit is smaller in surface roughness Ra than 0.1 ($\mu$m) and the gap between said retaining member of said first sealing unit and said retaining member of said second sealing unit is sealed within a tolerance less than $1 \times 10^{-9}$ Pa m$^3$/s.

10. A shaft sealing assembly as set forth in claim 9, in which said sleeve shaft is rotatable around its own axis with respect to said shaft housing.

11. A shaft sealing assembly as set forth in claim 9, in which said sleeve shaft is axially movable along its own axis with respect to said shaft housing.

12. A shaft sealing assembly as set forth in claim 9, in which said center shaft is rotatable around its own axis with respect to said sleeve shaft.

13. A shaft sealing assembly as set forth in claim 9, in which said center shaft is axially movable along its own axis with respect to said sleeve shaft.

14. A shaft sealing assembly for use in a vacuum processing apparatus, comprising:

a vacuum casing formed with a vacuum chamber maintained at a high pressure level less than $10^{-1}$ Pa and having a base portion formed with an opening to have said vacuum chamber of said vacuum casing held in communication with the atmosphere through said opening of said vacuum casing;

a shaft housing in the form of a cylindrical hollow shape and fixedly connected with said base portion of said vacuum casing, said shaft housing having an inner cylindrical surface;

a sleeve shaft in the form of a cylindrical hollow shape and received in said shaft housing to be movably supported by said shaft housing, said sleeve shaft held in coaxial alignment with said shaft housing and having a first axial end extending in said vacuum chamber of said vacuum casing, a second axial end extending in the atmosphere, an outer cylindrical surface smaller in diameter than said inner cylindrical surface of said shaft housing, and an inner cylindrical surface;

a center shaft in the form of a cylindrical shape and received in said sleeve shaft to be movably supported by said sleeve shaft, said center shaft held in coaxial alignment with said sleeve shaft and having a first axial end extending in said vacuum chamber of said vacuum casing, a second axial end extending in the atmosphere, and an outer cylindrical surface smaller in diameter than said inner cylindrical surface of said sleeve shaft;

a first sealing unit fixedly supported by said sleeve shaft, said first sealing unit including a retaining member in the form of an annular ring shape and fixedly supported by said sleeve shaft, and a sealing ring in the form of an annular ring shape and securely retained by said retaining member of said first sealing unit, said sealing ring of said first sealing unit intervening between said center shaft and said retaining member of said first sealing unit to hermetically seal the gap between said center shaft and said retaining member of said first sealing unit, said sealing ring of said first sealing unit including an annular resilient member formed with an annular groove, and an annular spring member received in said annular groove of said annular resilient member and retained by said annular resilient member, said annular resilient member of said sealing ring having a peripheral portion securely retained by said retaining member, and a sealing lip integrally formed with said peripheral portion of said annular resilient member and radially inwardly extending from said peripheral portion of said annular resilient member to be held in contact with said outer cylindrical surface of said center shaft, said annular spring member of said sealing ring operative to impart a force to said sealing lip of said annular resilient member to ensure that said sealing lip of said annular resilient member is held in tight contact with said outer cylindrical surface of said center shaft; and a second sealing unit fixedly supported by said base portion of said vacuum casing, said second sealing unit including a retaining member in the form of an annular ring shape and fixedly supported by said base portion of said vacuum casing, and a sealing ring in the form of an annular ring shape and securely retained by said retaining member of said second sealing unit, said sealing ring of said second sealing unit intervening between said sleeve shaft and said retaining member of said second sealing unit to hermetically seal the gap between said sleeve shaft and said retaining member of said second sealing unit, said sealing ring of said second sealing unit including an annular resilient member formed with an annular groove, and an annular spring member received in said annular groove of said annular resilient member and retained by said annular resilient member, said annular resilient member of said sealing ring having a peripheral portion securely retained by said retaining member, and a sealing lip integrally formed with said peripheral portion of said annular resilient member and radially inwardly extending from said peripheral portion of said annular resilient member to be held in contact with said outer cylindrical surface of said sleeve shaft, said annular spring member of said sealing ring operative to impart a force to said sealing lip of said annular resilient member to ensure that said sealing lip of said annular resilient member is held in tight contact with said outer cylindrical surface of said sleeve shaft in which said outer cylindrical surface of said center shaft is smaller in surface roughness Ra than 0.1 (μm) and the gap between said center shaft and said retaining member of said first sealing unit is sealed within a tolerance less than $1 \times 10^{-9}$ Pa m$^3$/s and said outer cylindrical surface of said sleeve shaft is smaller in surface roughness RA than 0.1 (μm) and the gap between said sleeve shaft and said retaining member of said second sealing unit is sealed within a tolerance less than $1 \times 10^{-9}$ Pa m$^3$/s.

15. A shaft sealing assembly as set forth in claim 14, which further comprises a first labyrinth seal unit intervening between said sleeve shaft and said center shaft to be exposed to said vacuum chamber of said vacuum casing, and a second labyrinth seal unit intervening between said vacuum casing and said sleeve shaft to be exposed to said vacuum chamber of said vacuum casing, said first labyrinth seal unit including an outer ring member provided on said first axial end of said sleeve shaft, and an inner ring member provided on said first axial end of said center shaft, said outer and inner ring members of said first labyrinth seal unit collectively forming an interstice therebetween, said second labyrinth seal unit including an outer ring member provided on said base portion of said vacuum casing, and an inner ring member provided on said first axial end of said sleeve shaft, said outer and inner ring members of said second labyrinth seal unit collectively forming an interstice therebetween.

16. A shaft sealing assembly as set forth in claim 15, which further comprises a base member in the form of a circular shape and provided on said first axial end of said center shaft, a first fixed member in the form of an annular ring shape and provided on said first axial end of said sleeve shaft, and a second fixed member in the form of an annular ring shape and provided on said base portion of said vacuum casing, said base member and said first fixed member collectively constituting said first labyrinth seal unit, said first and second fixed members collectively constituting said second labyrinth seal unit.

17. A shaft sealing assembly as set forth in claim 14, in which said sleeve shaft is rotatable around its own axis with respect to said shaft housing.

18. A shaft sealing assembly as set forth in claim 14, in which said sleeve shaft is axially movable along its own axis with respect to said shaft housing.

19. A shaft sealing assembly as set forth in claim 14, in which said center shaft is rotatable around its own axis with respect to said sleeve shaft.

20. A shaft sealing assembly as set forth in claim 14, in which said center shaft is axially movable along its own axis with respect to said sleeve shaft.

* * * * *